United States Patent
Bergmann et al.

(10) Patent No.: US 11,837,585 B2
(45) Date of Patent: Dec. 5, 2023

(54) WAFER LEVEL PACKAGING OF LIGHT EMITTING DIODES (LEDS)

(71) Applicant: CREELED, INC., Durham, NC (US)

(72) Inventors: Michael John Bergmann, Raleigh, NC (US); David Todd Emerson, Chapel Hill, NC (US); Joseph G. Clark, Raleigh, NC (US); Christopher P. Hussell, Cary, NC (US)

(73) Assignee: CreeLED, Inc., Durham, NC (US)

( * ) Notice: Subject to any disclaimer, the term of this patent is extended or adjusted under 35 U.S.C. 154(b) by 277 days.

(21) Appl. No.: 17/103,509

(22) Filed: Nov. 24, 2020

(65) Prior Publication Data

US 2021/0104503 A1    Apr. 8, 2021

Related U.S. Application Data

(63) Continuation of application No. 15/499,520, filed on Apr. 27, 2017, now Pat. No. 10,854,584, which is a
(Continued)

(51) Int. Cl.
*H01L 23/00*    (2006.01)
*H01L 33/62*    (2010.01)
(Continued)

(52) U.S. Cl.
CPC .......... *H01L 25/0756* (2013.01); *H01L 24/14* (2013.01); *H01L 24/94* (2013.01);
(Continued)

(58) Field of Classification Search
CPC ............... H01L 25/0756; H01L 33/507; H01L 33/50–508; H01L 2933/0041; H02L 33/507
See application file for complete search history.

(56) References Cited

U.S. PATENT DOCUMENTS 5,955,747 A    9/1999  Ogihara et al.
6,791,119 B2   9/2004  Slater, Jr. et al.
(Continued)

FOREIGN PATENT DOCUMENTS

JP    5657563 B2    1/2015

OTHER PUBLICATIONS

Schnitzer, I. et al., "30% external quantum efficiency from surface textured, thin-film light-emitting diodes," Applied Physics Letters, vol. 63, Issue 16, Oct. 18, 1993, American Institute of Physics, pp. 2174-2176.
(Continued)

*Primary Examiner* — Matthew C Landau
*Assistant Examiner* — Mark Hatzilambrou
(74) *Attorney, Agent, or Firm* — Withrow & Terranova, P.L.L.C.; Vincent K. Gustafson

(57) ABSTRACT

An LED wafer includes LED dies on an LED substrate. The LED wafer and a carrier wafer are joined. The LED wafer that is joined to the carrier wafer is shaped. Wavelength conversion material is applied to the LED wafer that is shaped. Singulation is performed to provide LED dies that are joined to a carrier die. The singulated devices may be mounted in an LED fixture to provide high light output per unit area.

20 Claims, 28 Drawing Sheets

Related U.S. Application Data continuation of application No. 13/608,397, filed on Sep. 10, 2012, now Pat. No. 9,653,643.

(60) Provisional application No. 61/621,746, filed on Apr. 9, 2012.

(51) Int. Cl.
| | |
|---|---|
| *H01L 33/00* | (2010.01) |
| *H01L 33/38* | (2010.01) |
| *H01L 33/48* | (2010.01) |
| *H01L 33/50* | (2010.01) |
| *H01L 33/22* | (2010.01) |
| *H01L 25/075* | (2006.01) |

(52) U.S. Cl.
CPC .......... *H01L 33/0095* (2013.01); *H01L 33/38* (2013.01); *H01L 33/486* (2013.01); *H01L 33/507* (2013.01); *H01L 33/62* (2013.01); H01L 24/81 (2013.01); H01L 33/0093 (2020.05); H01L 33/22 (2013.01); H01L 33/50 (2013.01); H01L 2224/13013 (2013.01); H01L 2224/13014 (2013.01); H01L 2224/13147 (2013.01); H01L 2224/13639 (2013.01); H01L 2224/1403 (2013.01); H01L 2224/1411 (2013.01); H01L 2224/14051 (2013.01); H01L 2224/14131 (2013.01); H01L 2224/14155 (2013.01); H01L 2224/14177 (2013.01); H01L 2224/81193 (2013.01); H01L 2224/81203 (2013.01); H01L 2224/81805 (2013.01); H01L 2224/81895 (2013.01); H01L 2224/94 (2013.01); H01L 2924/01322 (2013.01); H01L 2924/12041 (2013.01); H01L 2924/12042 (2013.01); H01L 2933/0033 (2013.01); H01L 2933/0041 (2013.01)

(56) References Cited

U.S. PATENT DOCUMENTS

| | | | |
|---|---|---|---|
| 6,889,902 | B2 | 5/2005 | Rumsey |
| 8,716,724 | B2 | 5/2014 | von Malm et al. |
| 8,969,897 | B2 | 3/2015 | Choi |
| 8,981,395 | B2 | 3/2015 | Choi et al. |
| 9,130,127 | B2 | 9/2015 | Katsuno et al. |
| 9,166,108 | B2 | 10/2015 | Unosawa |
| 9,171,882 | B2 | 10/2015 | Akimoto et al. |
| 9,172,002 | B2 | 10/2015 | Wang et al. |
| 9,172,021 | B2 | 10/2015 | Sugizaki et al. |
| 9,196,653 | B2 | 11/2015 | Leatherdale et al. |
| 9,231,037 | B2 | 1/2016 | Shimayama |
| 9,293,674 | B2 | 3/2016 | Kususe et al. |
| 9,337,175 | B2 | 5/2016 | Seo et al. |
| 9,653,643 | B2 | 5/2017 | Bergmann et al. |
| 9,666,764 | B2 | 5/2017 | Bergmann et al. |
| 2002/0123164 | A1 | 9/2002 | Slater, Jr. et al. |
| 2003/0075723 | A1 | 4/2003 | Heremans et al. |
| 2004/0229418 | A1 | 11/2004 | Hashimoto |
| 2006/0071225 | A1 | 4/2006 | Beeson et al. |
| 2006/0163589 | A1 | 7/2006 | Fan et al. |
| 2007/0057270 | A1 | 3/2007 | Bour et al. |
| 2008/0006838 | A1 | 1/2008 | Hattori et al. |
| 2008/0179611 | A1 | 7/2008 | Chitnis et al. |
| 2008/0211416 | A1 | 9/2008 | Negley et al. |
| 2009/0029495 | A1 | 1/2009 | Li et al. |
| 2009/0057690 | A1 | 3/2009 | Chakraborty |
| 2009/0242897 | A1 | 10/2009 | Bergmann et al. |
| 2009/0283787 | A1 | 11/2009 | Donofrio et al. |
| 2009/0321769 | A1 | 12/2009 | Keller et al. |
| 2010/0067241 | A1 | 3/2010 | Lapatovich et al. |
| 2010/0120183 | A1 | 5/2010 | Kim et al. |
| 2010/0144118 | A1 | 6/2010 | Yang et al. |
| 2010/0163900 | A1 | 7/2010 | Seo et al. |
| 2010/0244060 | A1 | 9/2010 | Lee et al. |
| 2010/0279737 | A1 | 11/2010 | Joppek et al. |
| 2011/0068701 | A1 | 3/2011 | van de Ven et al. |
| 2011/0084294 | A1 | 4/2011 | Yao |
| 2011/0198648 | A1 | 8/2011 | Jung |
| 2011/0204387 | A1 | 8/2011 | Kim et al. |
| 2011/0215360 | A1* | 9/2011 | Wang ..................... H01L 24/17 257/E33.056 |
| 2011/0248287 | A1 | 10/2011 | Yuan et al. |
| 2011/0266569 | A1 | 11/2011 | Basin et al. |
| 2012/0074441 | A1 | 3/2012 | Seo et al. |
| 2013/0052759 | A1 | 2/2013 | Odnoblyudov et al. |
| 2013/0175560 | A1 | 7/2013 | Odnoblyudov et al. |
| 2014/0070245 | A1 | 3/2014 | Haberern et al. |
| 2015/0228876 | A1 | 8/2015 | Place et al. |
| 2015/0249196 | A1 | 9/2015 | Williams et al. |
| 2017/0229431 | A1 | 8/2017 | Bergmann et al. |

OTHER PUBLICATIONS

Non-Final Office Action for U.S. Appl. No. 13/608,397, dated Jan. 31, 2014, 10 pages.
Non-Final Office Action for U.S. Appl. No. 13/608,397, dated Apr. 18, 2014, 11 pages.
Final Office Action for U.S. Appl. No. 13/608,397, dated Sep. 11, 2014, 14 pages.
Non-Final Office Action for U.S. Appl. No. 13/608,397, dated Jul. 23, 2015, 24 pages.
Non-Final Office Action for U.S. Appl. No. 13/608,397, dated Dec. 23, 2015, 19 pages.
Final Office Action for U.S. Appl. No. 13/608,397, dated Apr. 6, 2016, 25 pages.
Advisory Action and Examiner-Initiated Interview Summary for U.S. Appl. No. 13/608,397, dated Jun. 2, 2016, 5 pages.
Advisory Action for U.S. Appl. No. 13/608,397, dated Jun. 13, 2016, 3 pages.
Non-Final Office Action for U.S. Appl. No. 13/608,397, dated Sep. 8, 2016, 31 pages.
Notice of Allowance for U.S. Appl. No. 13/608,397, dated Jan. 3, 2017, 8 pages.
International Search Report and Written Opinion for International Patent Application No. PCT/US2013/033696, dated Aug. 2, 2013, 10 pages.
International Preliminary Report on Patentability for International Patent Application No. PCT/US2013/033696, dated Oct. 23, 2014, 8 pages.
Non-Final Office Action for U.S. Appl. No. 15/499,520, dated Nov. 26, 2018, 14 pages.
Final Office Action for U.S. Appl. No. 15/499,520, dated May 14, 2019, 18 pages.
Advisory Action, Examiner-Initiated Interview Summary, and AFCP 2.0 Decision for U.S. Appl. No. 15/499,520, dated Aug. 6, 2019, 6 pages.
Non-Final Office Action for U.S. Appl. No. 15/499,520, dated Sep. 4, 2019, 14 pages.
Final Office Action for U.S. Appl. No. 15/499,520, dated Mar. 2, 2020, 16 pages.
Notice of Allowance and Examiner-Initiated Interview Summary for U.S. Appl. No. 15/499,520, dated Jul. 14, 2020, 9 pages.
Non-Final Office Action for U.S. Appl. No. 15/647,823, dated Feb. 12, 2018, 5 pages.
Final Office Action for U.S. Appl. No. 15/647,823, dated Jun. 11, 2018, 6 pages.
Notice of Allowance for U.S. Appl. No. 15/647,823, dated Jul. 26, 2018, 8 pages.
Non-Final Office Action for U.S. Appl. No. 14/691,314, dated May 2, 2018, 11 pages.

* cited by examiner

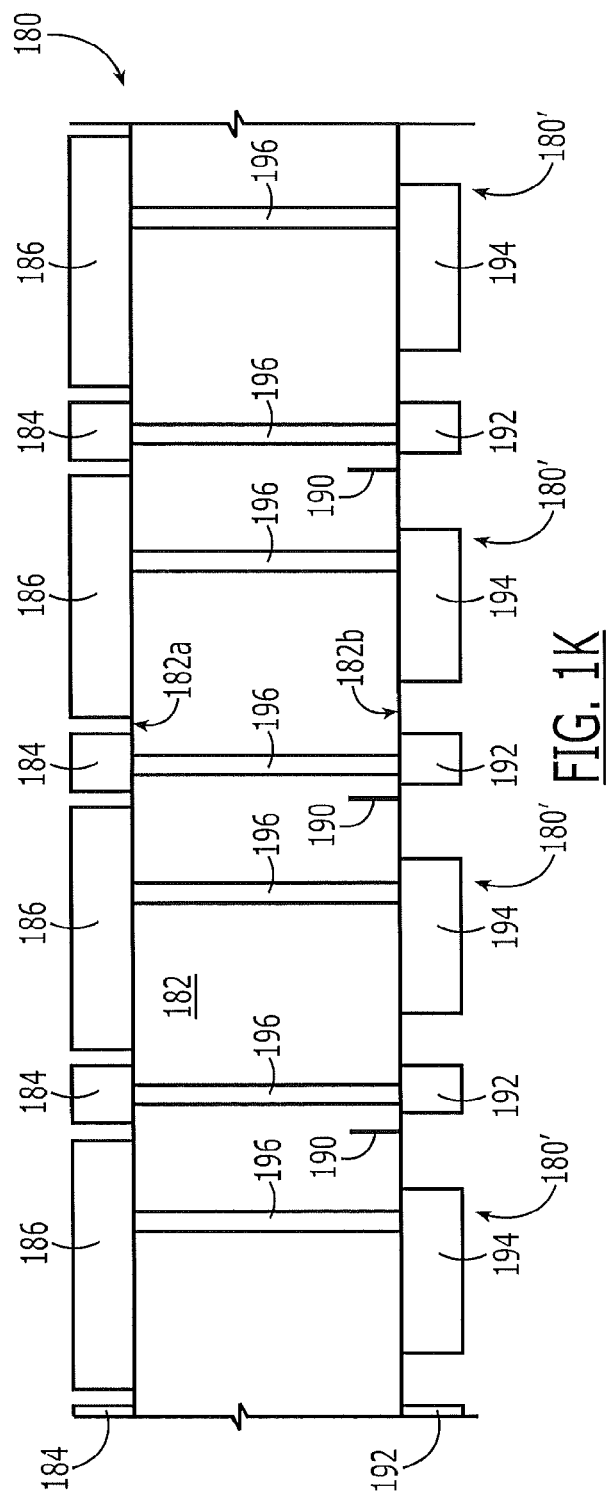

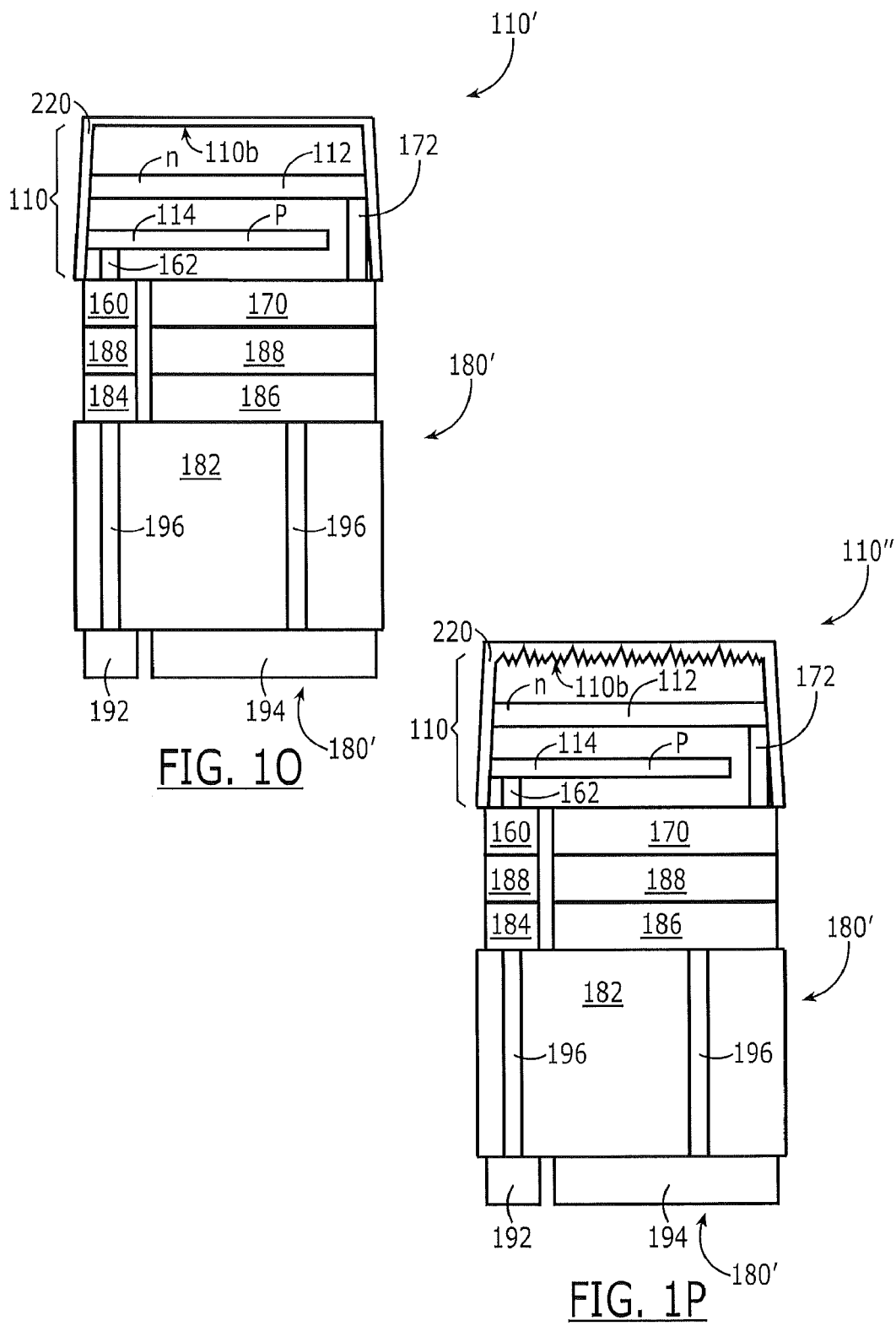

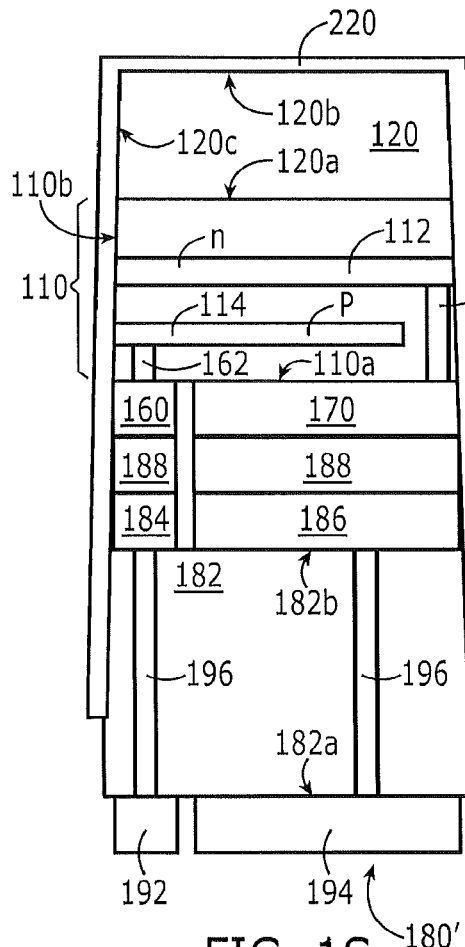
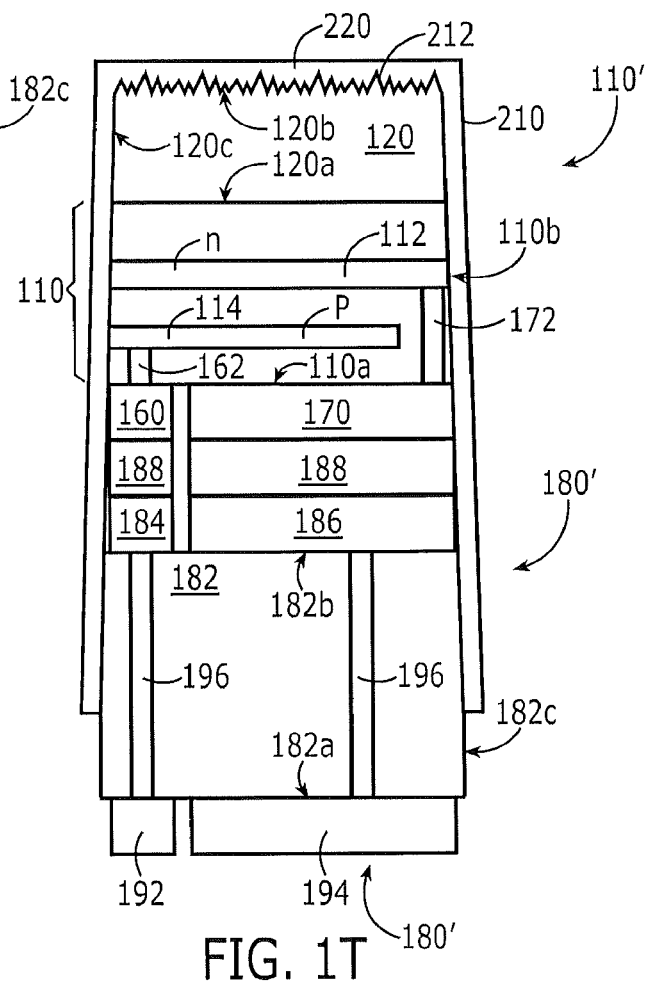
FIG. 1S
FIG. 1T

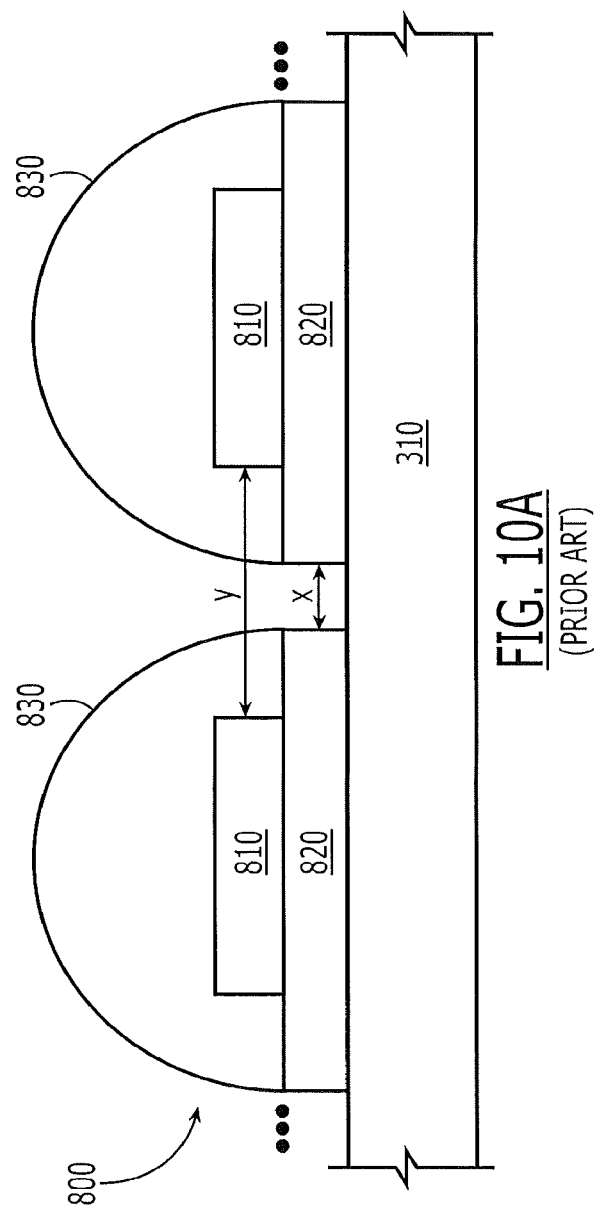

WAFER LEVEL PACKAGING OF LIGHT EMITTING DIODES (LEDS)

CROSS-REFERENCE TO RELATED APPLICATION

This application is a continuation of U.S. patent application Ser. No. 15/499,520 filed on Apr. 27, 2017 and issuing as U.S. Pat. No. 10,854,584 on Dec. 1, 2020, which is a continuation of U.S. patent application Ser. No. 13/608,397 filed on Sep. 10, 2012 and issuing as U.S. Pat. No. 9,653,643 on May 16, 2017, and claims the benefit of U.S. Provisional Patent Application No. 61/621,746, filed Apr. 9, 2012, entitled Wafer Level Packaging of Light Emitting Diodes (LEDs), assigned to the assignee of the present invention. The entire disclosures of the foregoing patent applications and patents are hereby incorporated herein by reference in their entireties as if set forth fully herein.

BACKGROUND

This invention relates to light emitting devices and assemblies and methods of manufacturing the same, and more particularly, to Light Emitting Diodes (LEDs) and assemblies thereof.

LEDs are widely known solid-state lighting elements that are capable of generating light upon application of voltage thereto. LEDs generally include a diode region having first and second opposing faces, and include therein an n-type layer, a p-type layer and a p-n junction. An anode contact ohmically contacts the p-type layer and a cathode contact ohmically contacts the n-type layer. The diode region may be epitaxially formed on a substrate, such as a sapphire, silicon, silicon carbide, gallium arsenide, gallium nitride, etc., growth substrate, but the completed device may not include a substrate. The diode region may be fabricated, for example, from silicon carbide, gallium nitride, gallium phosphide, aluminum nitride and/or gallium arsenide-based materials and/or from organic semiconductor-based materials. Finally, the light radiated by the LED may be in the visible or ultraviolet (UV) regions, and the LED may incorporate wavelength conversion material such as phosphor.

LEDs are increasingly being used in lighting/illumination applications, with a goal being to provide a replacement for the ubiquitous incandescent light bulb.

SUMMARY

Various embodiments described herein provide methods of fabricating a plurality of Light Emitting Diodes (LEDs). An LED wafer is provided that includes a plurality of LED dies on an LED substrate, the plurality of LED dies including anode and cathode contacts on a face thereof that is remote from the LED substrate. A carrier wafer is also provided. The LED wafer and the carrier wafer are joined, so that the anode and cathode contacts are adjacent the carrier wafer and the LED substrate is remote from the carrier wafer. The LED wafer that is joined to the carrier wafer is shaped. Wavelength conversion material is applied to the LED wafer that is shaped. Finally, singulation is performed on the carrier wafer and the LED wafer, to provide a plurality of LED dies, a respective one of which is joined to a respective carrier die, and having a length and width similar to the carrier die to which it is joined.

In some embodiments, the carrier wafer is scribed to define the plurality of carrier dies that are of similar length and width as the plurality of LED dies. The scribing may be performed before or after the joining. In other embodiments, the shaping comprises beveling the LED substrate. In still other embodiments, the shaping comprises texturing the LED substrate. In yet other embodiments, the shaping comprises thinning or removing the LED substrate, and the thinning or removing may be followed by texturing the LED dies. In yet other embodiments, the shaping comprises beveling the LED dies.

In some embodiments, singulating is followed by removing the respective carrier die. In other embodiments, singulating is followed by mounting at least one of the LED dies directly on a light fixture mounting board and mounting the light fixture mounting board including the at least one of the LED dies mounted directly thereon, in a light fixture housing to provide a light fixture. In still other embodiments, the mounting at least one of the LED dies directly on a light fixture mounting board and the mounting the light fixture mounting board in a light fixture housing are performed without providing a dome on the at least one of the LED dies.

In still other embodiments, the carrier wafer includes arrays of contacts on opposing faces thereof and an array of through-vias that electrically connect respective contacts on the opposing faces to one another. In other embodiments, the arrays of contacts on the opposing faces have different dimensions therebetween.

LEDs according to various other embodiments described herein may include a semiconductor LED die that includes an LED epi region and a carrier die that is electrically connected to the LED die, wherein the LED epi region and the carrier die have sides that are within 100 μm of one another in length. In some embodiments, the LED epi region and the carrier die have same side lengths. In other embodiments, the LED produces at least 100, and in some embodiments at least 150, and in yet other embodiments at least about 200 lumens, of cool white light in some embodiments, per watt per square millimeter. In other embodiments, the LED produces at least 30 and in some embodiments at least 70, and in yet other embodiments at least about 140 lumens of warm white light per watt per square millimeter. In some embodiments, an anode and a cathode are both provided on the carrier die, remote from the LED die, and in other embodiments, the LED die further includes a substrate.

Light emitting diodes according to other embodiments can comprise a semiconductor LED die that includes an LED epi region and a carrier die that is electrically connected to the LED die, wherein the LED epi region and the carrier dies have sides that are within about 15% of one another in length. In other embodiments, the LED epi region and carrier die have areas that are within 70% of one another, within 85% of one another, or have same areas. In some embodiments, the LED epi region and the carrier die have the same side lengths. In still other embodiments, the LED may produce at least 45, and in some embodiments at least 100, and in other embodiments at least about 200 lumens, of cool white light in some embodiments, per watt per square millimeter. In still other embodiments, the LED may produce at least 30, and in some embodiments at least 70, and in other embodiments at least about 140 lumens of warm white light. In some embodiments, an anode and a cathode are both provided on the carrier die, remote from the LED die, and in other embodiments, the LED die further includes a substrate.

In still other embodiments, an LED comprises a semiconductor LED die and a carrier die that is electrically connected to the LED die, wherein the LED produces at least 45 lumens, of cool white light in some embodiments, per watt per square millimeter of area of the carrier die. In some embodiments, the LED produces at least 100 lumens, and in other embodiments at least about 200 lumens, of cool white light in some embodiments, per watt per square millimeter of the area of the carrier die. In still other embodiments, the LED produces at least 30 lumens, and in other embodiments at least 70 lumens, and in still other embodiments at least about 140 lumens of warm white light per square millimeter of area of the carrier die. In still other embodiments, the LED produces at least 45 lumens, and in some embodiments at least 100 lumens, and in other embodiments at least about 200 lumens, of cool white light in some embodiments, per watt per cubic millimeter of volume of the LED. In yet other embodiments, the LED produces at least 30 lumens, and in some embodiments at least 70 lumens, and in other embodiments at least about 140 lumens of warm white light per cubic millimeter of volume of the LED. In some embodiments, an anode and a cathode are both provided on the carrier die, remote from the LED die, and in other embodiments, the LED die further includes a substrate.

LEDs according to other embodiments include a semiconductor LED die and a carrier die that is electrically connected to the LED die, wherein the carrier die has an area of less than about 2 square millimeters, and in some embodiments less than about 1 square millimeter, and in other embodiments, an area of about 0.5 square millimeter or less. In any of these embodiments, the LED may have a height of about one millimeter. In still other embodiments, an LED comprises a semiconductor LED die and a carrier die that is electrically connected to the LED die, wherein the LED has a height of less than about 1.5 millimeters, and in some embodiments less than about 1 millimeter.

LEDs according to still other embodiments may include a semiconductor LED die comprising a semiconductor LED die that includes inner and outer faces and a plurality of sidewalls therebetween, and a carrier die that includes inner and outer faces and a plurality of sidewalls therebetween, wherein the inner face of the LED die is electrically connected to the inner face of the carrier die. A phosphor layer extends directly on the outer face of the LED die, directly on the plurality of sidewalls of the LED die and directly on the plurality of sidewalls of the carrier die. In some embodiments, the phosphor layer covers the outer face of the LED die and the plurality of sidewalls of the LED die and partially covers the plurality of sidewalls of the carrier die. In yet other embodiments, the phosphor layer protrudes beyond the carrier die in a direction along the faces of the carrier die.

Yet other embodiments may include a protective layer on the phosphor layer, remote from the LED die and the carrier die. In some embodiments, the phosphor layer comprises phosphor particles in a silicone binder, and the protective layer comprises a silicon layer that is free of the phosphor particles therein.

In still other embodiments, the outer face of the carrier die is configured for surface mounting of the LED. Moreover in some embodiments, the outer face of the carrier die includes a feature, such as a notch in a contact, configured to allow identification of an orientation of the LED.

LEDs according to still other embodiments may include a carrier, an LED epi region, a primary optic distinct from the LED epi region and a phosphor layer, wherein the carrier, LED epi region, primary optic and phosphor layer have outer edges that are within 100 µm of one another, and in other embodiments have same size outer edges. As used herein, a "primary optic" means an optical element that causes the luminous flux from the LED to assume a specific illumination pattern. In some embodiments described herein, a substrate of the LED epi region may assume the role of a primary optic.

LEDs according to any of the embodiments described herein may be combined with a light fixture mounting board on which the carrier die is directly mounted and a light fixture housing in which the light fixture mounting board is mounted, to provide a light fixture. The light fixture is free of a dome between the carrier die and the light fixture housing.

An LED light fixture according to various embodiments described herein may include a light fixture mounting board, a plurality of LEDs directly mounted on the light fixture mounting board and a light fixture housing in which the light fixture mounting board including the plurality of LEDs thereon is mounted. The light fixture is free of a dome between a respective LED and the light fixture housing. The plurality of LEDs may comprise a plurality of semiconductor LED dies that are directly mounted on the light fixture mounting board without a carrier die therebetween.

Finally, methods of manufacturing LED light fixtures according to other embodiments described herein may include fabricating a plurality of LED wafers including wavelength converting material thereon at chip factory, dicing the LED wafers including the wavelength converting material thereon to produce a plurality of LED dies, and mounting the LED dies on a light fixture mounting board at a module factory or at a fixture factory and mounting the light fixture mounting board in a light fixture at a fixture factory. The fabricating, the dicing and the mounting bypass LED packaging factories. In these embodiments, the chip, module and fixture factories do not perform an operation of providing domes on the plurality of LED dies.

BRIEF DESCRIPTION OF THE DRAWINGS

FIG. 10A is a cross-section of a conventional packing of LED dies on a carrier substrate.

DETAILED DESCRIPTION

Figure 1A:
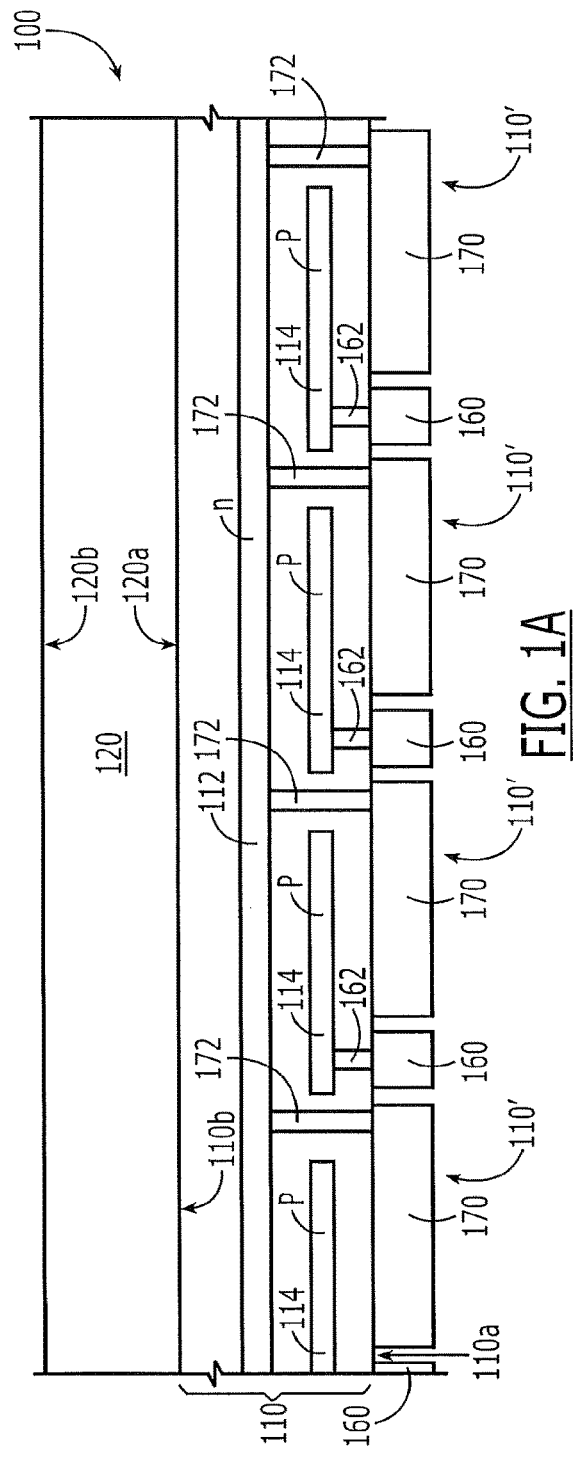
FIGS. 1A-1P and 1S-1U are cross-sections of one or more LEDs during intermediate and final wafer level packaging, according to various embodiments described herein.

The present invention now will be described more fully with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" another element, it can be directly on the other element or intervening elements may also be present. Furthermore, relative terms such as "beneath" or "overlies" may be used herein to describe a relationship of one layer or region to another layer or region relative to a substrate or base layer as illustrated in the figures. It will be understood that these terms are intended to encompass different orientations of the device in addition to the orientation depicted in the figures. Finally, the term "directly" means that there are no intervening elements. As used herein, the term "and/or" includes any and all combinations of one or more of the associated listed items and may be abbreviated as "/".

It will be understood that, although the terms first, second, etc, may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional and/or other illustrations that are schematic illustrations of idealized embodiments of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, a region illustrated or described as a rectangle will, typically, have rounded or curved features due to normal manufacturing tolerances. Thus, the regions illustrated in the figures are schematic in nature and their shapes are not intended to illustrate the precise shape of a region of a device and are not intended to limit the scope of the invention, unless otherwise defined herein.

Unless otherwise defined herein, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification and will not be interpreted in an idealized or overly formal sense unless expressly so defined herein.

Some embodiments now will be described generally with reference to gallium nitride (GaN)-based light emitting diodes on silicon carbide (SiC)-based growth substrates for case of understanding the description herein. However, it will be understood by those having skill in the art that other embodiments of the present invention may be based on a variety of different combinations of growth substrate and epitaxial layers. For example, combinations can include AlGaInP diodes on GaP growth substrates; InGaAs diodes on GaAs growth substrates; AlGaAs diodes on GaAs growth substrates; SiC diodes on SiC or sapphire ($Al_2O_3$) growth substrates and/or a Group III-nitride-based diode on gallium nitride, silicon carbide, aluminum nitride, sapphire, zinc oxide and/or other growth substrates. Moreover, in other embodiments, a growth substrate may not be present in the finished product. For example, the growth substrate may be removed after forming the light emitting diode, and/or a bonded substrate may be provided on the light emitting diode after removing the growth substrate. In some embodiments, the light emitting diodes may be gallium nitride-based LED devices manufactured and sold by Cree, Inc, of Durham, North Carolina.

Various embodiments described herein can increase the lumen/dollar performance of LEDs by performing packaging-like process steps at the wafer level, to allow reduction of handling and assembling of discrete level LED dies or chips into a package. Thus, various embodiments described herein can merge chip or die fabrication and packaging into fewer steps, to thereby allow leveraging of the parallel process cost reduction available by performing wafer level processing of the die rather than component level processing. Various embodiments described herein can move die and component singulation to the end of the LED lamp manufacturing line. Moreover, various embodiments described herein can also reduce redundant characterization steps between the LED die and LED package testing, which can allow further reduction in manufacturing costs, such as labor, work-in-process time and capital expense. Finally, various embodiments described herein can tightly pack LED dies on a mounting board to allow increased luminous efficiency.

Various embodiments described herein may arise from recognition that, conventionally, LED dies are singulated and sorted, and placed upon die sheets, which are shipped to a components factory, only to have the dies removed from the die sheets and repopulated onto panels. Accordingly, conventional LED manufacturing begins with a wafer, singulates the wafer and then basically reassembles the wafer, only to repeat the process of singulation followed by testing and measurements again. Various embodiments described herein can provide methods of fabricating LEDs and methods of manufacturing LED light fixtures that can at least partially reduce or eliminate these redundancies. Moreover, various embodiments described herein can provide LEDs and LED light fixtures so manufactured.

FIG. 1A is a cross-sectional view of an LED wafer including a plurality of LED dies. Referring to FIG. 1A, the LED wafer 100 includes diode regions 110 having first and second opposing faces 110a, 110b, respectively, and including therein an n-type layer 112 and a p-type layer 114. Other layers or regions may be provided, which may include quantum wells, buffer layers, etc., that need not be described herein. Moreover, the n-type layer 112 and the p-type layer 114 may be adjacent one another to form a p-n junction or may be spaced apart from one another. Either or both layers may be at a surface of the diode region 110 or may be buried within the diode region. Anode contacts 160 ohmically contact the p-type layer 114 and extends on the first face 110a. The anode contacts 160 may directly ohmically contact the p-type layer 114, or may ohmically contact the p-type layer 114 byway of one or more conductive vias 162 and/or other intermediate layers. Cathode contacts 170 ohmically contact the n-type layer 112 and also extend on the first face 110a. The cathode contacts may directly ohmically contact the n-type layer 112, or may ohmically contact the n-type layer 112 by way of one or more conductive vias 172 and/or other intermediate layers. As illustrated in FIG. 1A, the anode contacts 160 and the cathode contacts 170 that both extend on the first face 110a are coplanar.

The diode region 110 also may be referred to herein as an "LED epi region" or simply as an "LED epi", because it is typically formed epitaxially on a substrate 120. For example, a Group III-nitride based LED epi 110 may be formed on a silicon carbide growth substrate. In some embodiments, the growth substrate may be present in the finished product. In other embodiments, the growth substrate may be thinned or removed. In still other embodiments, another substrate may be provided that is different from the growth substrate, and the other substrate may be bonded to the LED after removing the growth substrate. The LED epi 110 defines a plurality of LED dies 110'.

As also shown in FIG. 1A, a substrate 120, such as a transparent silicon carbide growth substrate or a transparent sapphire growth substrate, is included on the second face 110b of the diode region 110. The substrate 120 includes an inner face 120c adjacent the second face 110b of the diode region 110 and an outer face 120b, remote from the inner face 120C.

Figure 1B:
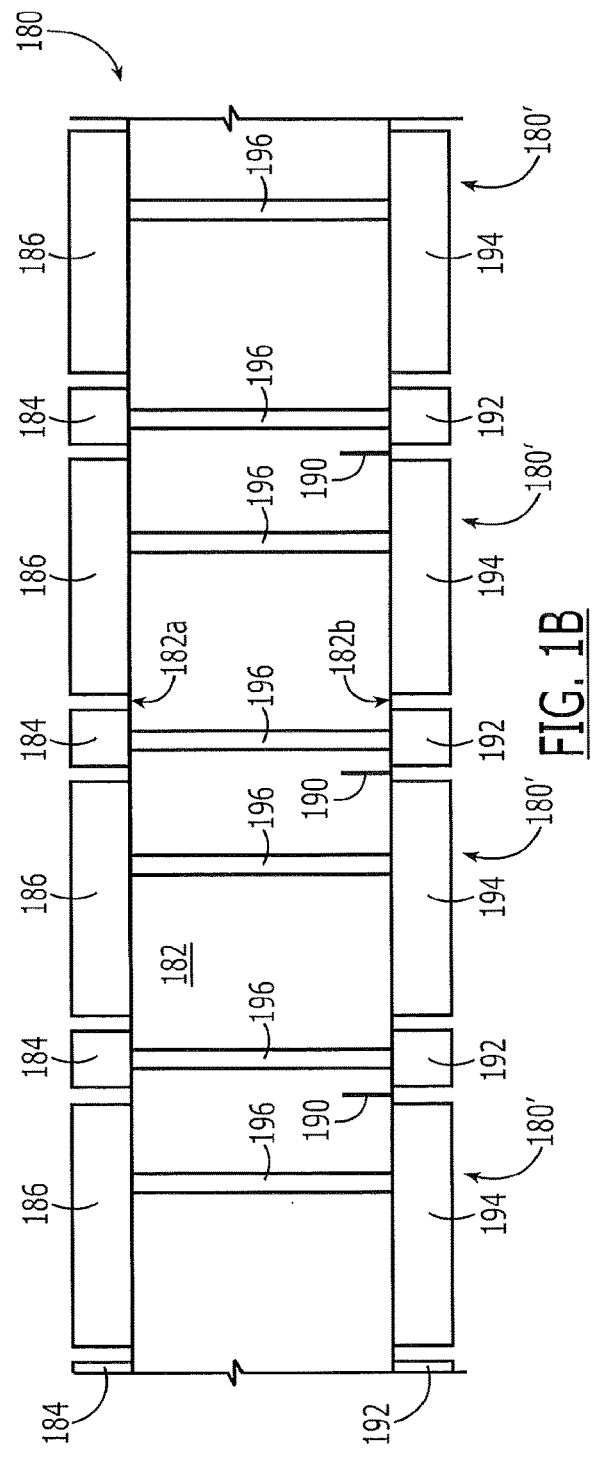
FIGS. 1Q and 1R are bottom views of a carrier substrate of FIG. 1K.

FIG. 1B illustrates a carrier wafer 18) that includes a body 182 that may comprise aluminum nitride (AlN), silicon and/or aluminum oxide. In other embodiments, metal core substrates, printed circuit boards and/or other carrier wafers may be used. The carrier wafer 180 includes a carrier wafer face 182a, and an anode pad 184 and a cathode pad 186 thereon. The anode and cathode pads may comprise silver-plated copper and/or other conductive materials. A packaged device anode 192 and a packaged device cathode 194 may be provided on a second face 182b of the body 182, and may be connected to the anode pad 184 and cathode pad 186, respectively, using internal vias and/or conductive layers 196 that extend in and/or around the body 182. The carrier wafer 180 may also include electrostatic discharge protection devices therein. In some embodiments, the body 182 comprises silicon and the vias 196 may be fabricated using conventional Through Silicon Via (TSV) technology. In some embodiments, the carrier wafer 180 is about 100 μm thick, and in other embodiments, the carrier wafer may be between about 30 μm and about 500 μm thick. The anode and cathode pads and the packaged device anode and cathode may be less than about 10 μm thick, in some embodiments.

In FIG. 1B, the anode pad 184 and the packaged device anodes 192 are of approximately the same size and shape. Moreover, the cathode pads 186 and the packaged device cathodes 194 are also of approximately the same size and shape. However, this need not be the case. For example, as shown in FIG. 1K, the packaged device anodes 192 and/or the packaged device cathodes 194 may be smaller than the corresponding anode pads 184 and cathode pads 186. Thus, more separation may be provided between the packaged device anodes 192 and cathodes 194 to provide a more package-friendly environment, since the placement ability at the packaging manufacturing level may be lower. As illustrated in FIG. 1K, a wider gap between the packaged device anode 192 and the packaged device cathode 194 may be provided. Thus, the packaged device anodes 192 and/or the packaged device cathodes 194 may be configured for surface mounting. Accordingly, FIGS. 1B and 1K illustrate a carrier wafer that includes arrays of contacts on opposing faces thereof, and an array of through vias that electrically connect a respective contact on the opposing faces to one another. Moreover, FIG. 1K illustrates embodiments wherein the corresponding contacts in the arrays of contacts on the opposing faces have different dimensions therebetween.

Figure 1C:
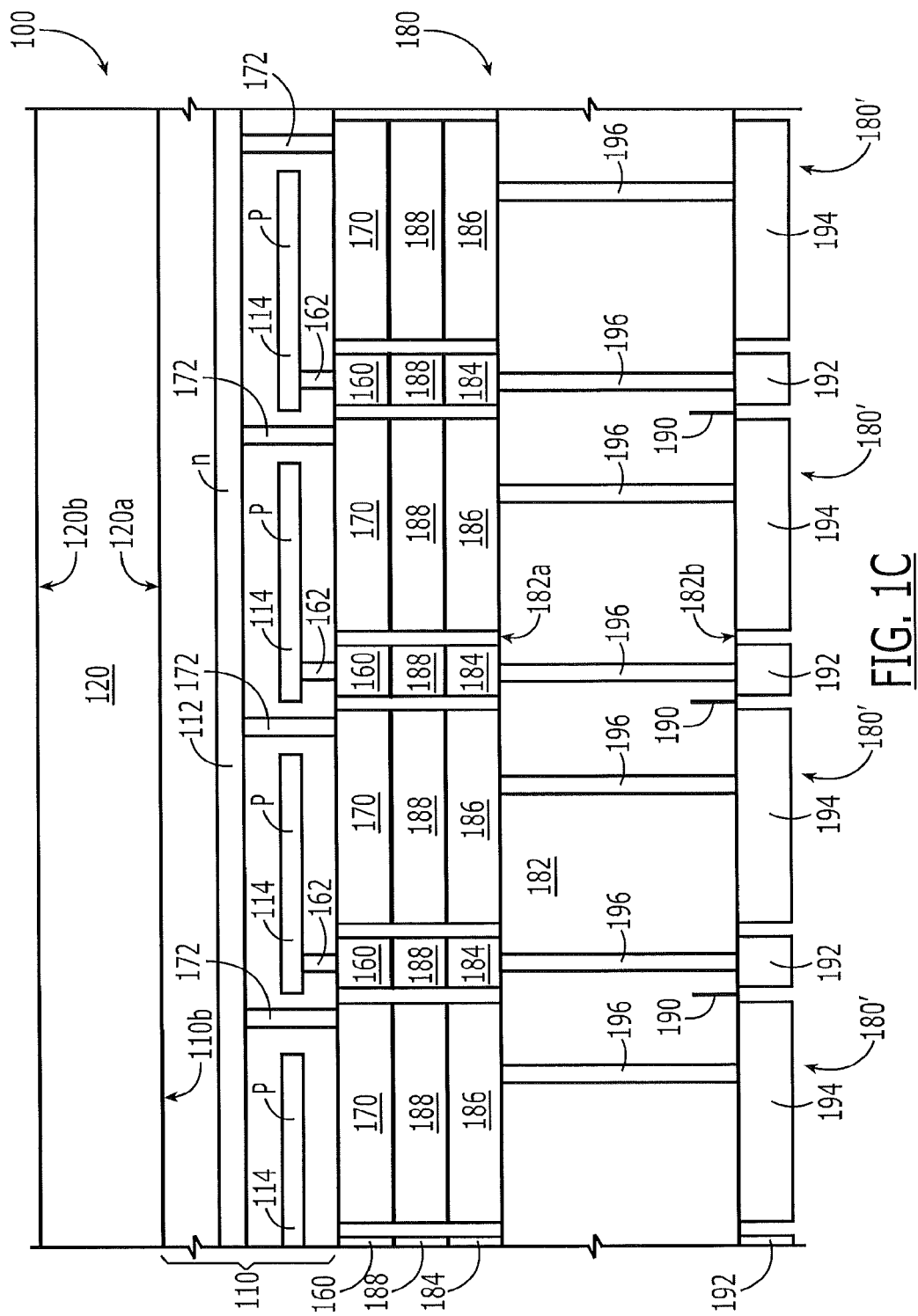
Figure 1D:
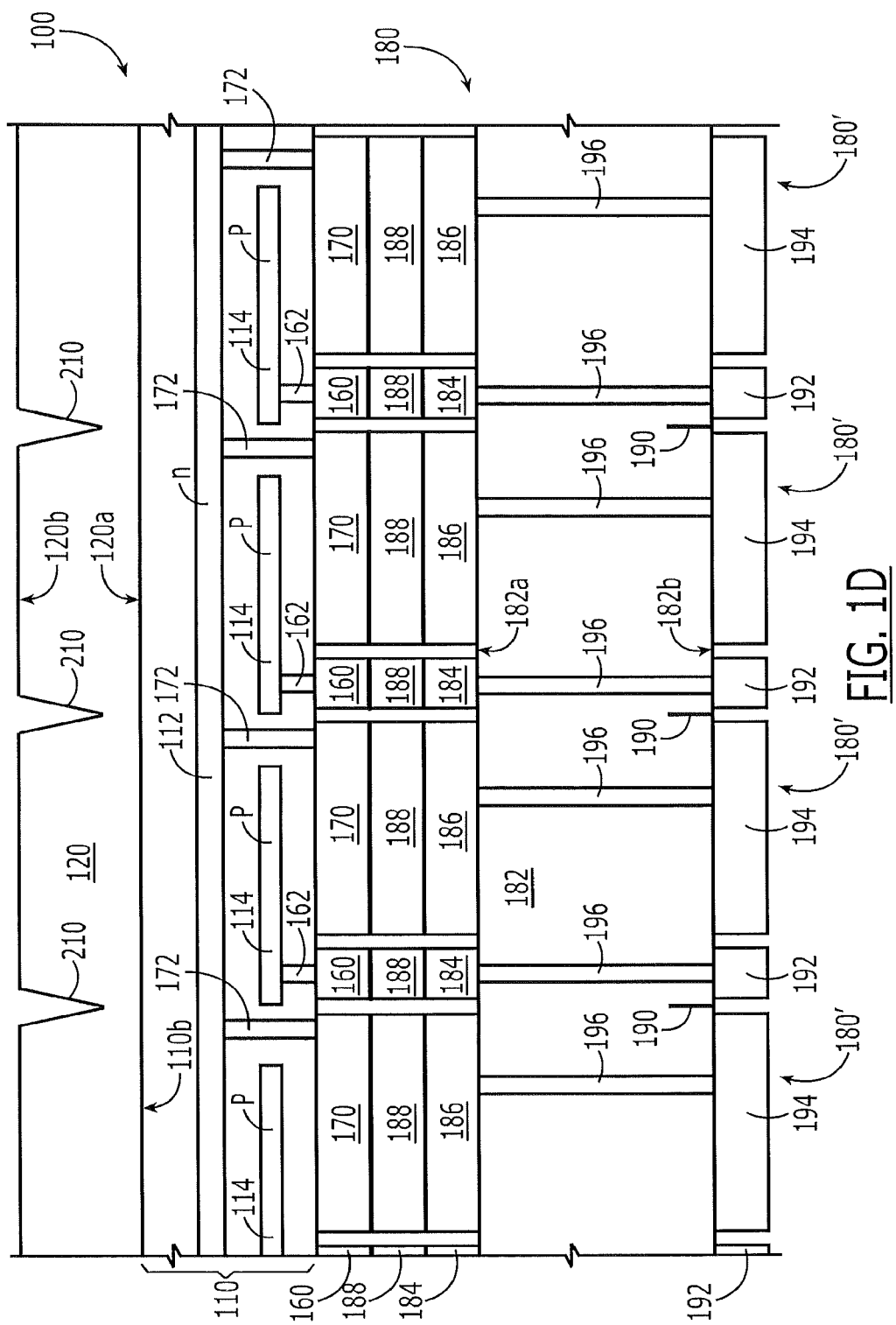
Figure 1E:
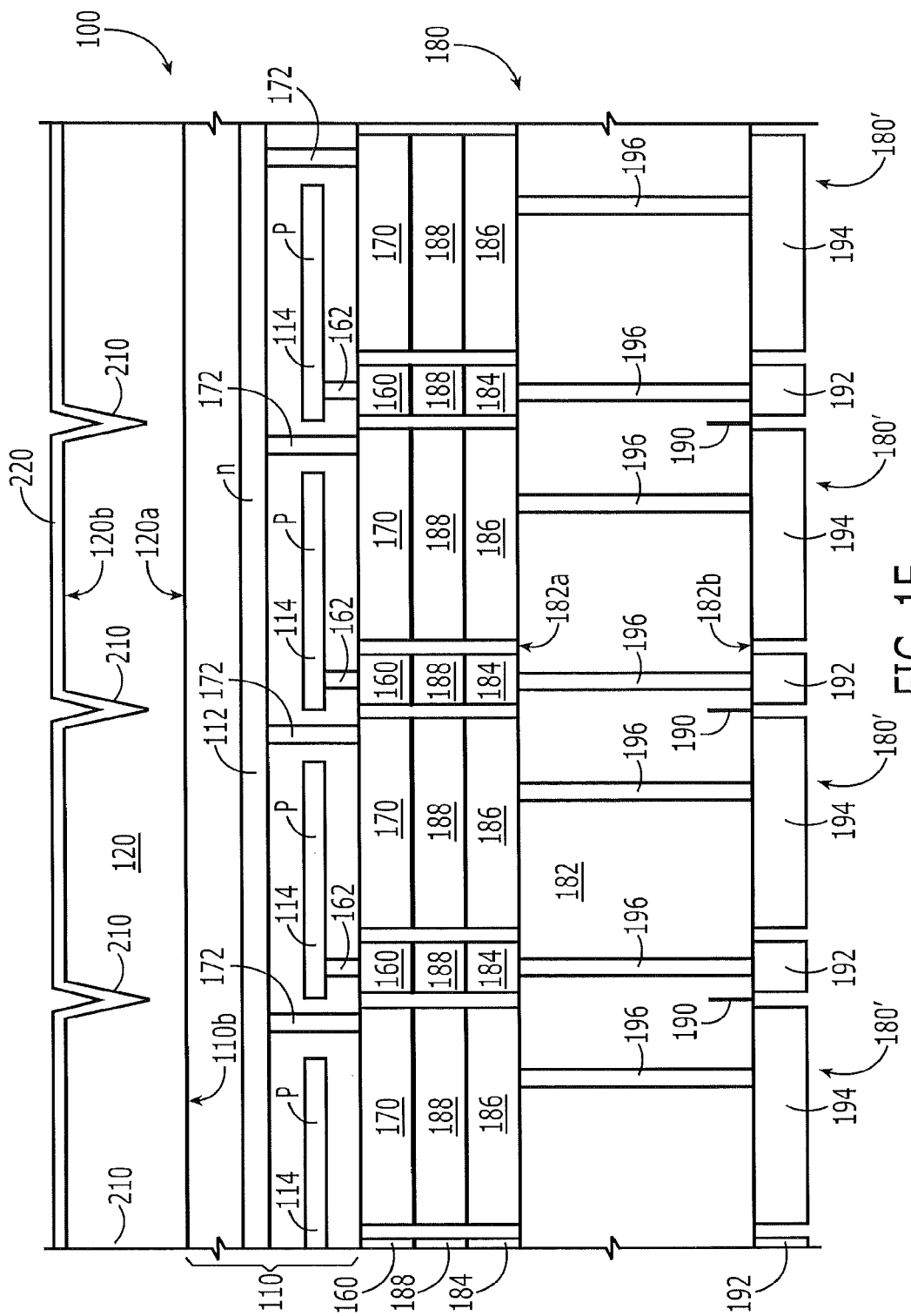
Figure 1F:
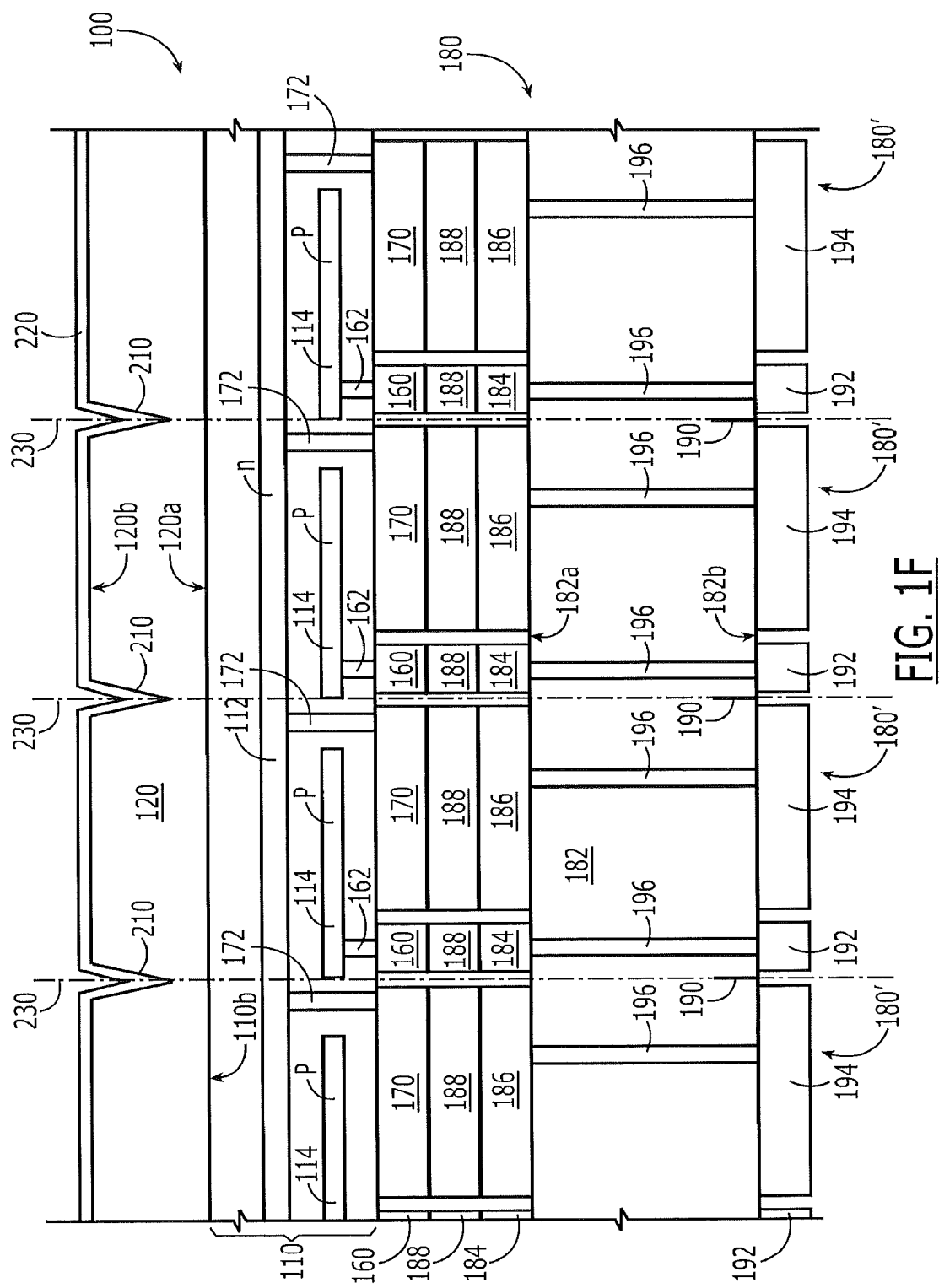
Figure 1G:
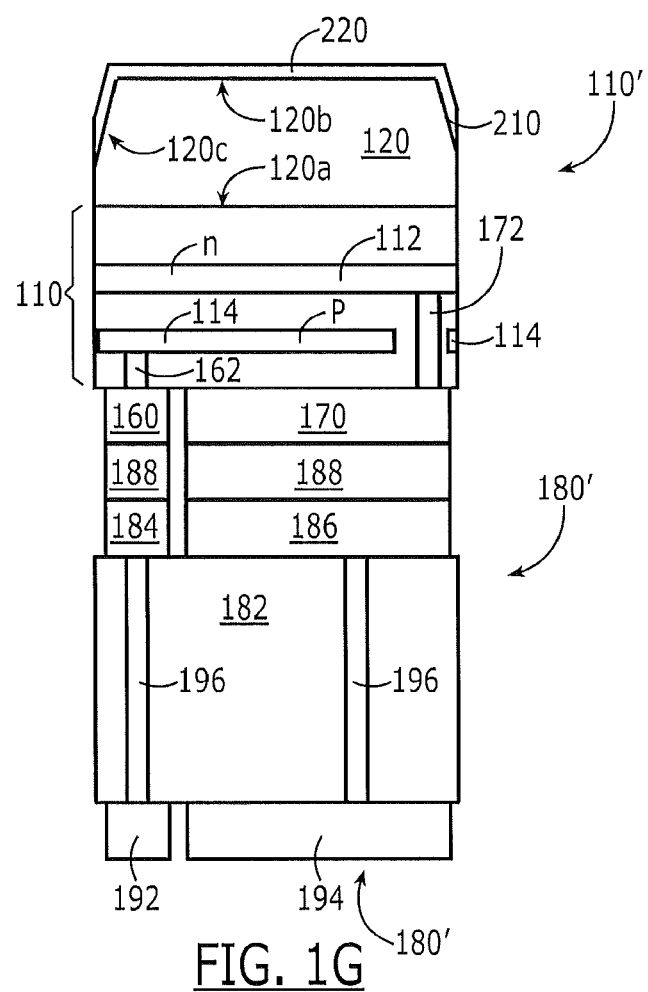
Figure 1H:
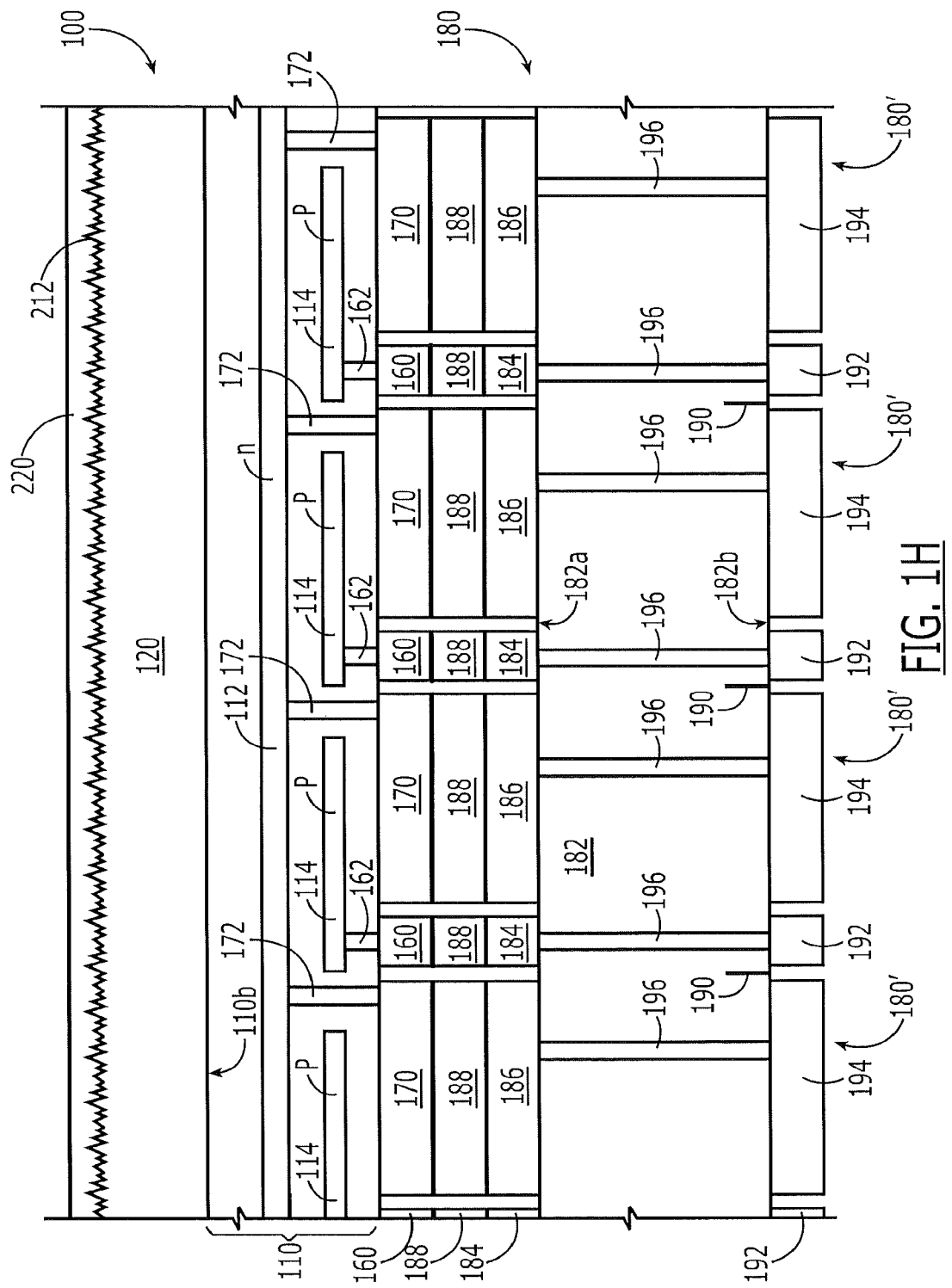
Figure 1I:
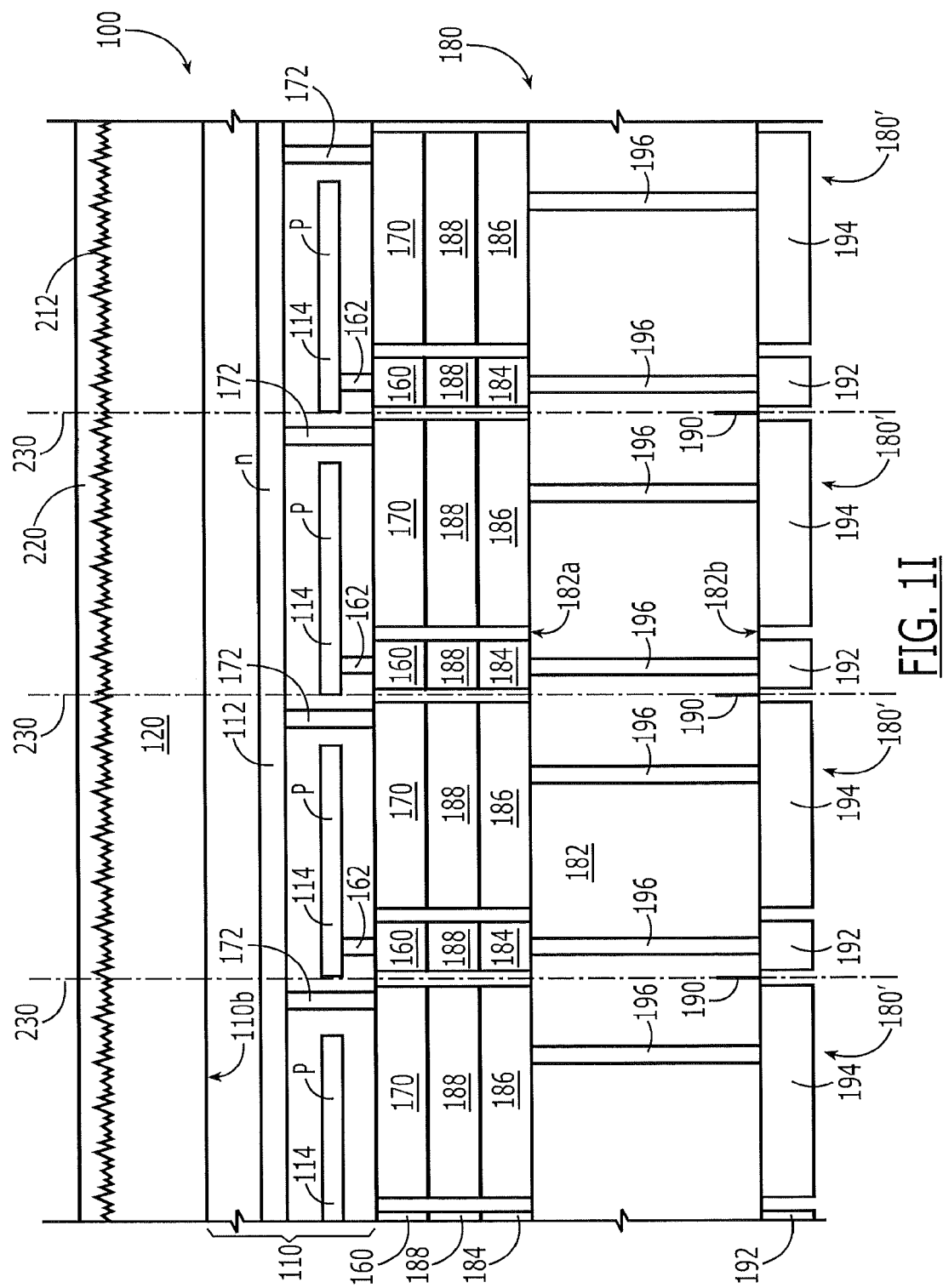
Figure 1J:
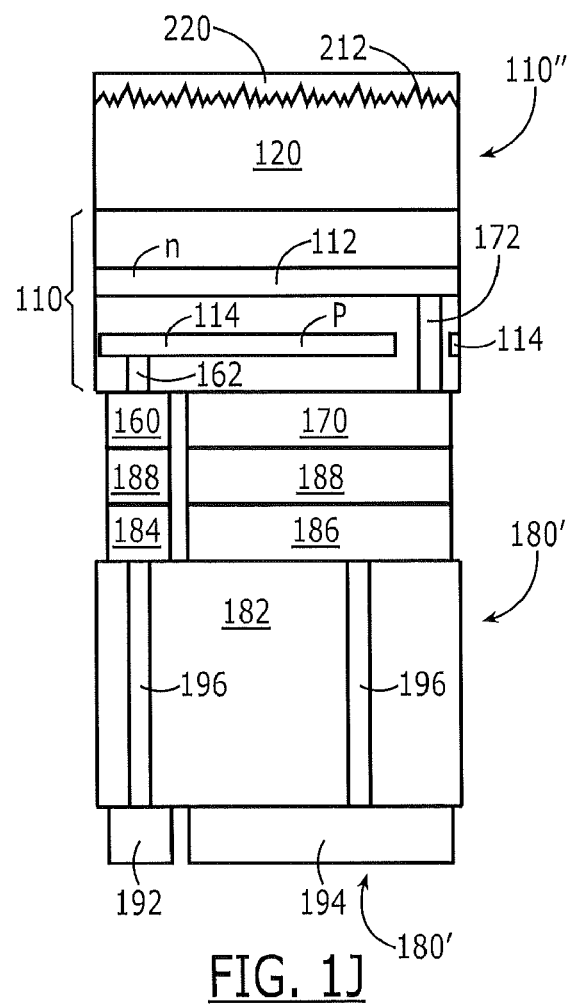
Figure 1L:
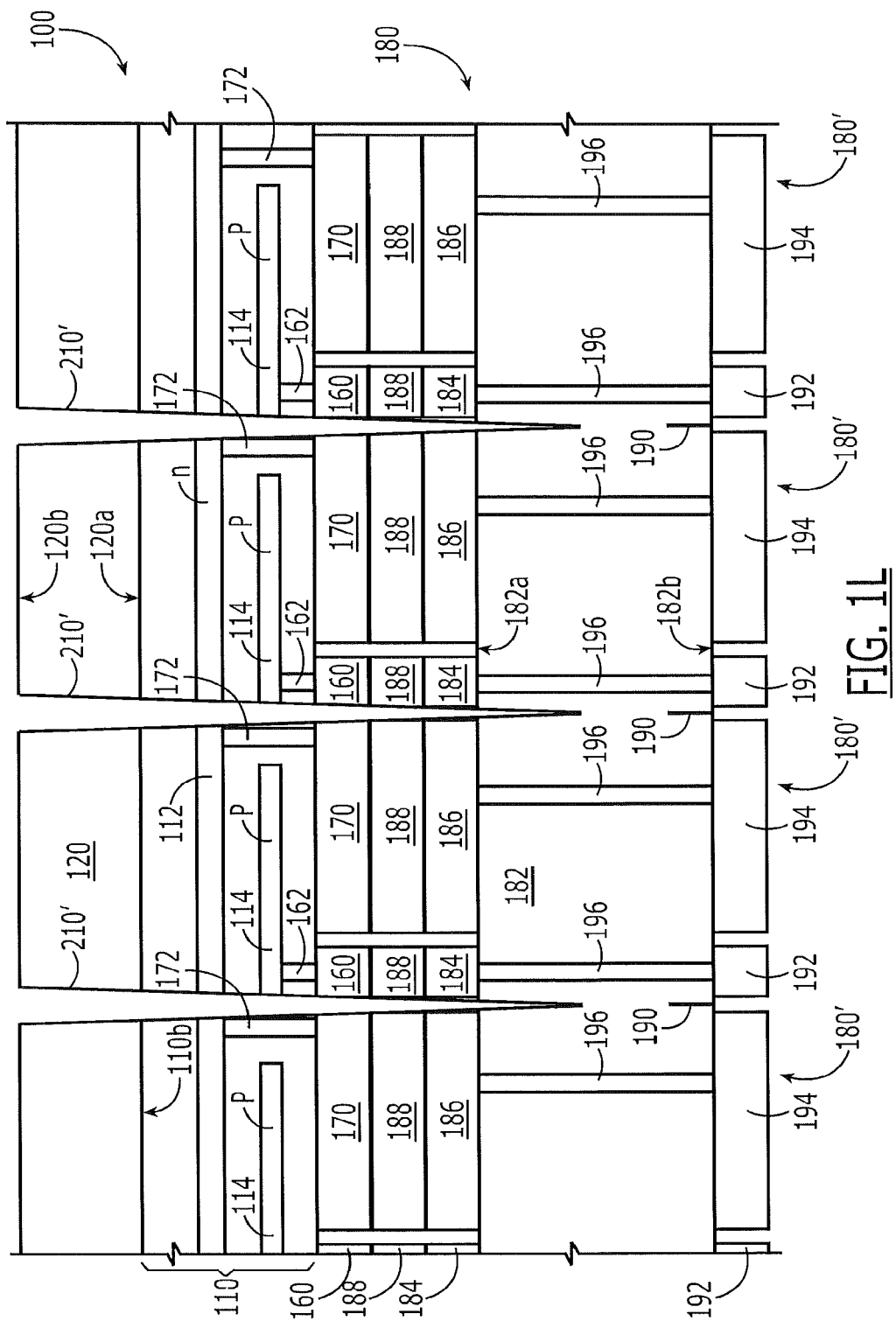
Figure 1M:
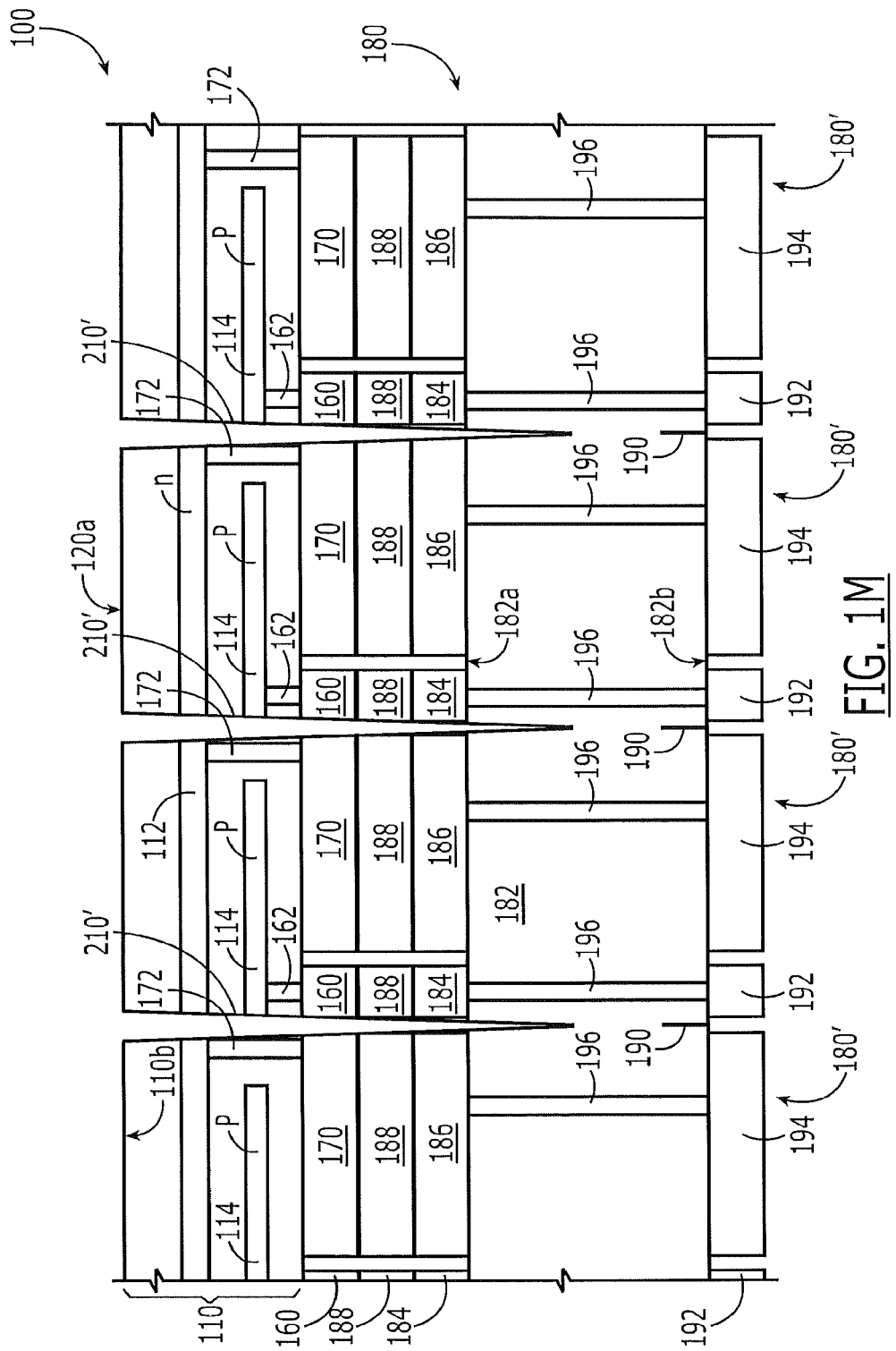
Figure 1N:
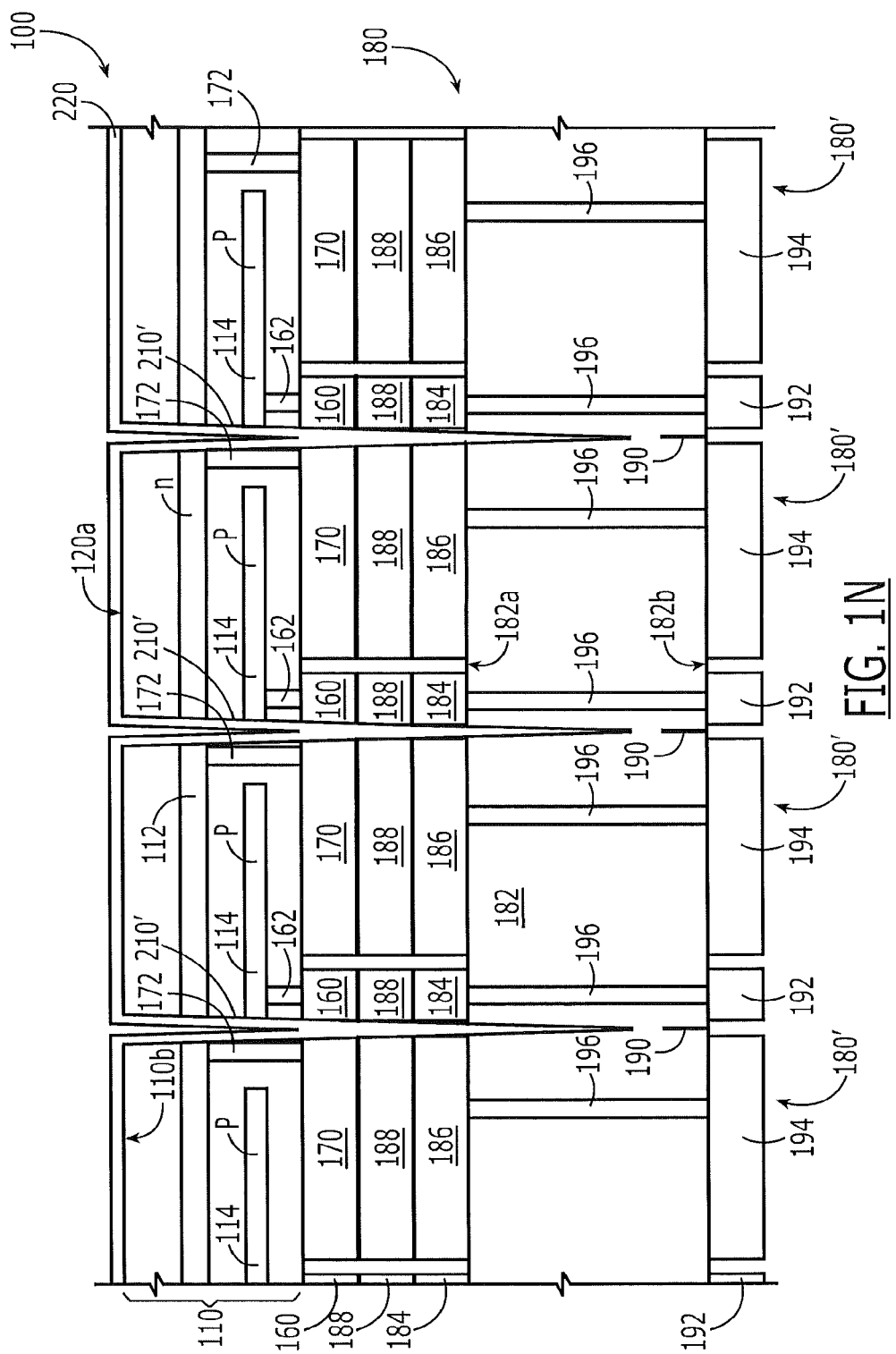
Figure 1Q:
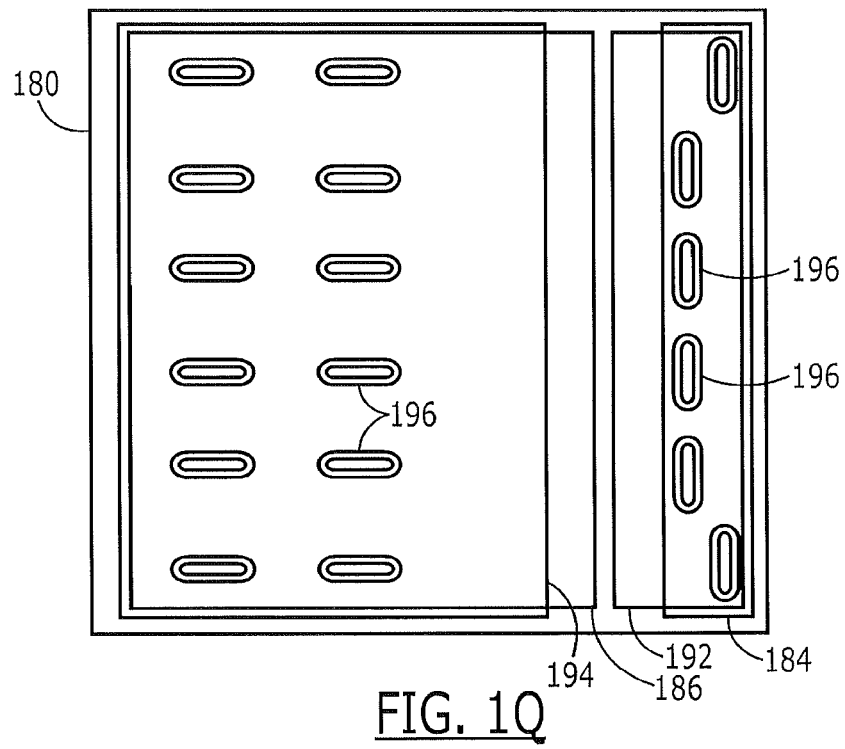
Figure 1R:
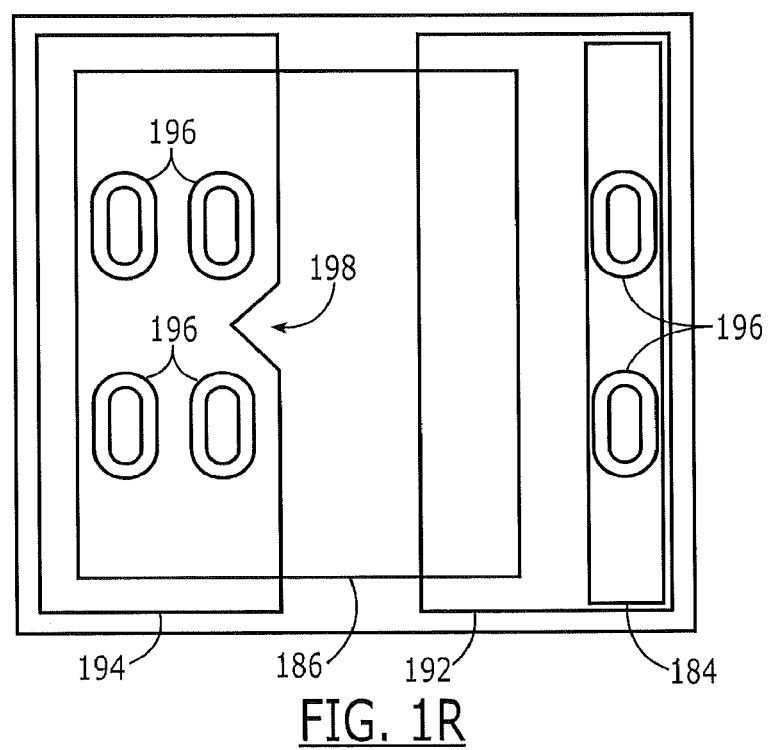

More specifically, FIGS. 1Q and 1R illustrate configurations of anode pads 184, packaged device anodes 192, cathode pads 186 and packaged device cathodes 194 on a carrier wafer 180, according to various embodiments described herein. As shown in FIG. 1Q, the packaged device anode 192 may be larger than the anode pad 184, and the packaged device cathode 194 may be smaller than the cathode pad 186, to facilitate surface mounting of the LED. In other embodiments, as shown in FIG. 1R, there may be more spacing between the packaged device anode 192 and the packaged device cathode 194, than between the anode pad 184 and the cathode pad 186, to facilitate surface mounting of the LED. Moreover, a feature, such as a notch 193 in the packaged device cathode 194 may be provided to allow identification of an orientation of the LED. Other types of orientation identification features may also be provided according to various other embodiments, and the orientation identification features may be provided in the packaged device anode 192, in the packaged device cathode 194 and/or on the body 180 of the carrier die. Accordingly, the carrier die may be configured for surface mounting of the LED and/or to allow identification of an orientation of the LED. In some embodiments, when the carrier has dimensions of about 0.7 mm×0.7 mm, the packaged device cathode 194 may have dimensions of about 0.65 mm×about 0.25 mm, the packaged device anode 192 may have dimensions of 0.65 mm×0.25 mm, and the spacing between the packaged device anode 192 and the packaged device cathode 194 may be about 0.15 mm.

FIG. 1A illustrates LED wafers that are configured for flip-chip mounting on a carrier wafer such as the carrier wafer 180 of FIG. 18. Various configurations of flip-chip mounted light emitting diode dies may be used in the LED wafers in various embodiments described herein. Other light emitting devices according to various embodiments described herein may be configured for non-flip-chip mounting on a mounting substrate, as described and illustrated, for example, in U.S. Patent Application Publication 201110031502 to Bergann et al, entitled "Light Emitting Diodes Including Integrated Backside Reflector and Die Attach", filed Aug. 10, 2009, assigned to the assignee of the present application, the disclosure of which is hereby incorporated herein by reference in its entirety as if set forth fully herein. Moreover, other light emitting devices according to various embodiments described herein may be configured as vertical light emitting devices, as described and illustrated, for example, in U.S. Pat. No. 6,791,119 to Slater, Jr et al., entitled "Light Emitting Diodes Including Modifications for Light Extraction", filed Jan. 25, 2002, assigned to the assignee of the present application, the disclosure of which is hereby incorporated herein by reference in its entirety as if set forth fully herein.

FIG. 1B also illustrates a plurality of scribe lines 190 in the second face 182b of the carrier wafer 180, that define a plurality of carrier dies that are of similar length and width as the plurality of LED dies 110' on the LED wafer 100. Scribing may take place using a diamond tool, a laser and/or other conventional scribing techniques. Moreover, scribing may not need to be performed in FIG. 1B, but may be performed after attaching the LED wafer 100 to the carrier wafer 180, as will be described below.

Accordingly, FIG. 1A illustrates providing an LED wafer 100 that includes a plurality of LED dies 110' on an LED substrate 120, the plurality of LED dies 110' including anode and cathode contacts 160, 170, on a face 110a thereof that is remote from the LED substrate 120. FIG. 1B illustrates providing a carrier wafer 180 and also illustrates an optional scribing 190 of the carrier wafer, to define a plurality of carrier dies 180' that are of similar length and width as the plurality of LED dies 110'.

Referring now to FIG. 1C, the LED wafer 100 and the carrier wafer 180 are joined, so that the anode and cathode contacts 160, 170 are adjacent the carrier wafer 180, and the LED substrate 120 is remote from the carrier wafer 180. More specifically, as illustrated in FIG. 1C, the LED wafer 100 is mounted on the carrier wafer 180, such that the first face 110a is adjacent the first carrier wafer face 182a, the second face 110b is remote from the carrier wafer 180, the anode pads 184 are adjacent the anode contacts 160, and the cathode pads 186 are adjacent the cathode contacts 170. In some embodiments, a bonding layer, such as a eutectic gold/tin solder layer 188, is used to electrically, thermally and/or mechanically connect the anode contacts 160 to the anode pads 184, and the cathode contacts 170 to the cathode pads 186. In other embodiments, direct attachment of the anode contacts 160 to the anode pads 184, and direct attachment of the cathode contacts 170 to the cathode pads 186 may be provided, for example using thermocompression bonding and/or other techniques.

Referring now to FIG. 1D, the LED substrate 120 that is joined to the carrier wafer 180 is shaped. In FIG. 1D, shaping takes place by forming bevels 210 in the second face 120b of the substrate 120, for example using a saw blade, laser, wet and/or dry etching, and/or other conventional beveling techniques. Various shapes of beveling and/or faceting may be provided. For example, an "X"-shaped cut may be performed on the outer face, and sidewall beveling 210 may also be performed. Prior to or after beveling, the substrate 120 may be thinned. In other embodiments, the entire LED substrate 120 may be removed. Moreover, in some embodiments, if scribing of the carrier wafer 180 did not take place prior to attachment in FIG. 1C, scribing may take place after attachment in FIG. 1D.

In FIG. 1D, the bevels 210 extend into the second face 120b of the substrate 120. However, deeper beveling may also be provided that extends through the substrate 120. In other embodiments, the bevels may extend into, and in some embodiments through, the diode regions 110. In yet other embodiments, the bevels may extend into the body 182 of the carrier wafer 189. Thus, for example, as illustrated in FIG. 1L, the bevels 210' extend through the substrate 120, through the diode region 110 and into the body 182 of the carrier wafer 180. By providing deeper bevels, a subsequent coating of phosphor (described below) can extend along the edges or sidewalls of the diode region 110, and can reduce or prevent production of undesired edge emission from the LED. For example, undesired blue edge emission may be reduced or prevented when a blue LED is used with yellow phosphor that extends along the edge or sidewalls of the diode region.

As was also noted above, in some embodiments, the entire LED substrate 120 may be removed. Thus, as illustrated in FIG. 1M, the substrate 120 is entirely removed. Substrate removal may take place prior to or after beveling. In other embodiments, the substrate may be thinned prior to beveling, and the remaining substrate may be removed after beveling.

Referring now to FIG. 1E, a wavelength conversion material 220 is applied to the LED substrate 120 that has been shaped. The wavelength conversion material 220, also generally referred to herein as "phosphor", may be provided according to various configurations. In some embodiments, the diode regions 110 are configured to emit blue light, for example light having a dominant wavelength of about 450-460 nm, and the wavelength conversion layer 220 comprises yellow phosphor, such as YAG:Ce phosphor, having a peak wavelength of about 550 nm. In other embodiments, the diode region 110 is configured to emit blue light upon energization thereof, and the wavelength conversion material 220 may comprise a mixture of yellow phosphor and red phosphor, such CASN-based phosphor. Instill other embodiments, the diode region is configured to emit blue light upon energization thereof, and the wavelength conversion material 220 may comprise a mixture of yellow phosphor, red phosphor and green phosphor, such as LuAG:Ce phosphor particles. Moreover, various combinations and subcombinations of these and/or other colors and/or types of phosphors may be used in mixtures and/or in separate layers. Various techniques may be used to apply the phosphor, including spraying, coating and/or other techniques. Phosphor preforms also may be applied.

Similarly, for deep beveling embodiments that were illustrated in FIG. 1M, a wavelength conversion material 220 may be applied according to any of the embodiments described above, as illustrated, for example, in FIG. 1N. As was already noted, by coating the diode region 110 with phosphor, undesired emission of, for example, excess blue light from the sidewalls or edge of the diode region may be reduced or prevented.

Referring now to FIG. 1F, singulation 230 is then performed on the carrier wafer 180 that has been scribed, and on the LED wafer 100 that has been joined to the carrier wafer 180 and that has been shaped 210 and that has wavelength conversion material 220 applied thereto. Singulation may take place along singulation lines 230, that correspond to the scribe lines 190, using conventional singulation techniques. As shown in FIG. 1G, the singulation provides a plurality of LED dies 110', a respective one of which is joined to a respective carrier die 180'. An anode 192 and a cathode 194 are provided on the carrier die 182, remote from the LED die 110. Moreover, a substrate 120 may also be provided. Note that only one of these LED dies/carrier dies is shown in FIG. 1G. FIG. 1O illustrates a singulated LED device of FIG. 1N, wherein the substrate 120 is not included, and the phosphor coating 220 extends along the sidewalls of the LED dies 110'.

Referring back to Figure D, substrate shaping by beveling was illustrated. However, other techniques of substrate shaping may be provided, as will now be described in connection with FIGS. 1H-1J. Specifically, FIG. 1H illustrates providing texturing 212 on the outer substrate face, followed by application of wavelength conversion material 220. Texturing may take place using etching and/or other techniques. Substrate thinning may also take place. In other embodiments, the entire LED substrate 120 may be removed, and texturing of the second face of the diode regions 110 may take place.

FIG. 1I illustrates singulation of the textured devices, as was also illustrated in FIG. 1F. FIG. 1J illustrates a resulting LED die 110" having a textured substrate. It will also be understood that, in other embodiments, beveling and texturing may be combined, for example by using a saw blade to provide the bevels of FIG. 1D and then texturing on the exposed surface as illustrated in FIG. 1H. In yet other embodiments, the substrate 120 may be removed, and texturing of the second (outer) face 110b of the LED 110' may be provided. FIG. 1P illustrates the singulation of the textured devices, which were subject to deep beveling, as was illustrated in FIG. 1N. The texturing may extend on the second (outer) face 110b of the LED die 110" and/or may extend along the sidewalls thereof. In addition, an X-cut may also be provided on the second face 110b of the LED die 110".

Figure 1U:
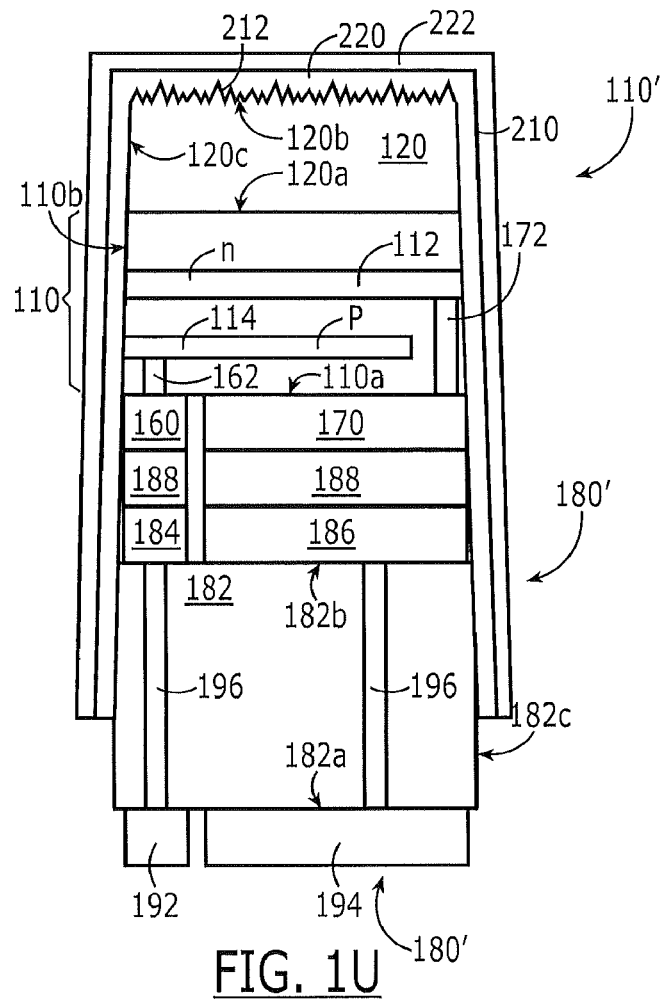

FIGS. 1S-1U also illustrate singulation of the devices according to various other embodiments described herein. Specifically, in FIG. 1S, the deep beveled wafers of FIG. 1L that include a shaped substrate 120 are singulated after a phosphor layer is applied thereto. Thus, as shown in FIG. 1S, the semiconductor LED die 110' includes an outer face 120b, an inner face 110a, and a plurality of sidewalls 110c therebetween. The carrier die 180' includes an outer face 182a, an inner face 182b, and a plurality of sidewalls 182c therebetween. The inner face 110a of the LED die 110' is electrically connected to the inner face 182b of the carrier die 182. A phosphor layer 220 extends directly on the outer face 120b of the LED die 110', directly on the plurality of sidewalls 110c of the LED die 110' and directly on the plurality of sidewalls 182c of the carrier die. In some embodiments, the phosphor layer covers the outer face 120b of the LED die 110' and the plurality of sidewalls 110c of the LED die 110', and partially covers the plurality of sidewalls 182c of the carrier die 180'. As also shown in FIG. 1, the phosphor layer 220 may protrude beyond the carrier die 182 in a direction along the inner face 182b and outer face 182a of the carrier die 180'. Thus, in FIG. 1S, the phosphor layer may protrude in the horizontal direction beyond the sidewalls 182c of the carrier die body 182. The extent of protrusion of the phosphor layer 220 may be controlled, for example, by the depth and/or profile of the shaping that takes place, by the thickness of the phosphor layer that is provided and/or by other techniques.

FIG. 1T illustrates other embodiments wherein texturing 212 of the outer face 120h of the semiconductor LED die 120 is provided, as was also illustrated, for example, in FIG. 1J.

FIG. 1U illustrates the addition of a protective layer 222 on the phosphor layer 220. In some embodiments, the phosphor layer 220 may comprise phosphor particles in a binder, such as a silicone binder, and the protective layer 222 may comprise a layer, such as a silicone layer, comprising for example the same silicone as the silicone binder, that is free of the phosphor particles therein. The protective layer 220 may be added prior to and/or after singulation.

FIGS. 1G, 1J, 1O, 1P, 1S, 1T and U also illustrate LEDs according to other embodiments that comprise a carrier 180', an LED epi region 110, a primary optic, such as substrate 120, that is distinct from the LED pi region 110, and a phosphor layer 220. The carrier 180', the LED epi region 110, the primary optic 120 and the phosphor layer 220 have outer edges that are within 100 μm of one another in some embodiments, and in other embodiments, have same size outer edges. In some embodiments, the primary optic can be other suitable materials and/or constructions, such as a molded silicone lens, for example when the substrate is removed.

Figure 2:
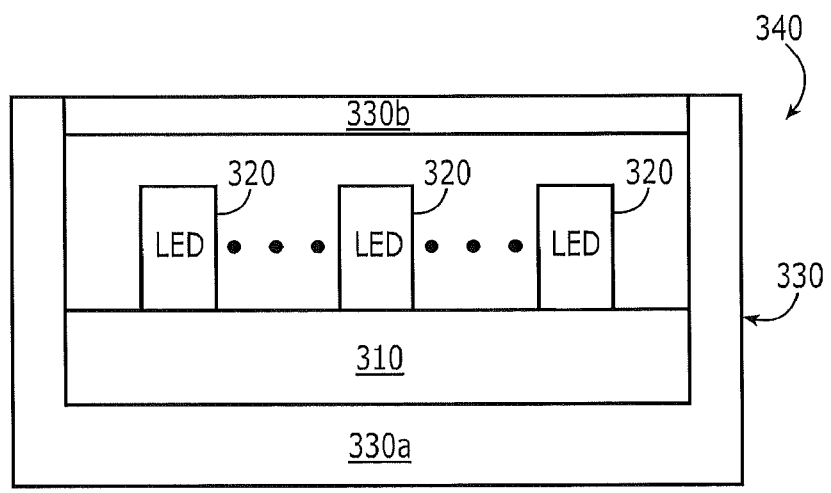
FIG. 2 is a cross-section of an LED die in a light fixture according to various embodiments described herein.

FIG. 2 illustrates the packaging of an LED die, for example an LED die of FIGS. 1G, 1J, 1O, 1P and/or 1S-1U, into an LED fixture. Specifically, as shown in FIG. 2, at least one of the LED dies 320, which may correspond to the product of FIGS. 1G, 1J, 1O, 1P and/or 1S-1U is directly mounted on a light fixture mounting board 310. The light fixture mounting board 310 is then mounted in a light fixture housing 330 to provide a light fixture 340. As illustrated in FIG. 2, the light fixture is free of a dome between the LE) die 320 and the light fixture housing 330. It will be understood that, as used herein, a "dome" may include a smooth or faceted structure. It will be understood that light fixture 340 is illustrated in FIG. 2 in a greatly simplified form, and does not include driver circuitry, power supplies, heat sinking and/or other conventional elements. Moreover, the housing 330 may include opaque/reflective portions 330a and transparent portions 330b, to allow light to emerge from the housing.

Figure 3:
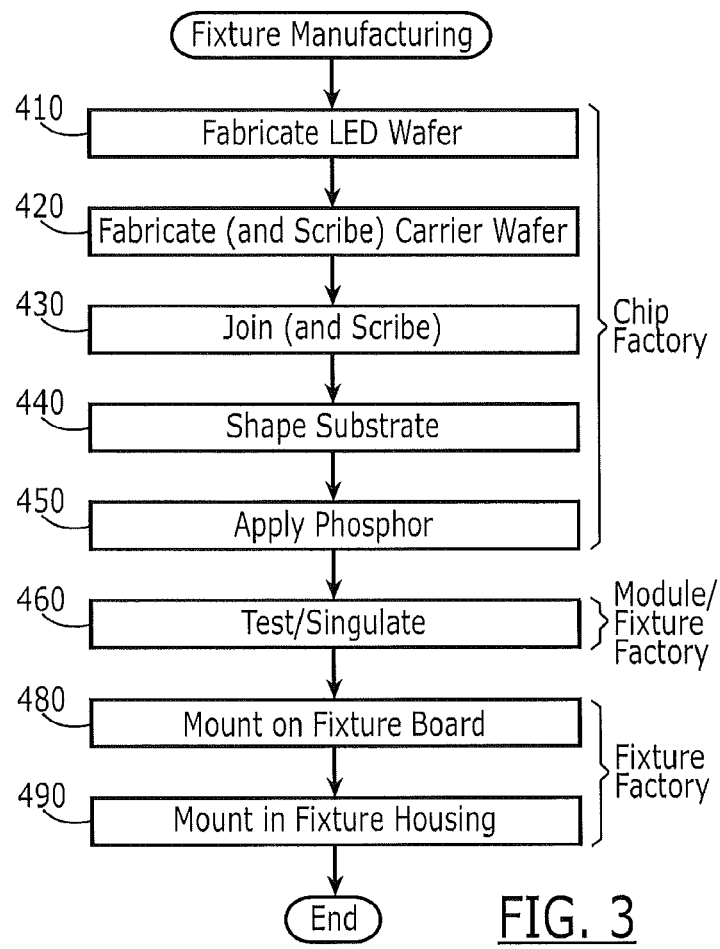
FIG. 3 is a flowchart of LED fixture manufacturing according to various embodiments described herein.

FIG. 3 is a flowchart of LED fixture manufacturing according to various embodiments described herein. Referring to FIG. 3, an LED wafer is fabricated at Block 410, for example as was illustrated in FIG. 1A. At Block 420, a carrier wafer is fabricated, as was illustrated, for example, in FIG. 1B or 1K, and is optionally scribed. At Block 430, the LED wafer and the carrier wafer are joined, as was illustrated, for example, in FIG. 1C. Scribing also may optionally take place. The substrate is then shaped at Block 440, as was illustrated, for example, in FIGS. 1D, 1H, 1L and/or 1M. At Block 450, phosphor is applied, as was illustrated, for example, in FIGS. 1E, 1H and/or 1N.

As also illustrated in FIG. 3, all of the operations of Blocks 410-450 may take place at a "chip factory". Thus, substrate carrier joining (Block 430), substrate shaping (Block 440) and phosphor application (Block 450) may be performed at a wafer level at a chip factory rather than being applied at a die level at a package factory.

Continuing with the description of FIG. 3, testing of the wafers that are provided by the chip factory at Block 450 may then be performed at Block 460 and singulation may also be performed at Block 460, as was illustrated, for example, in FIGS. 1F and/or 1L Testing may be performed prior to and/or after singulation at Block 460. Testing and singulation may take place at a separate "module factory", or may take place at the chip factory or at a "fixture factory". Accordingly, in some embodiments, the completed wafers from Block 450 may be shipped to a fixture factory, which is then responsible for testing, singulation and integration into a fixture. Optionally, the entire carrier die 180' of FIG. 1G or 1J may be removed at any desired point in the fixture manufacturing process, if desired. Then, at Block 480, the LED, for example the LED of FIGS. 1G, 1J, 1O, 1P and/or 1S-1U, is mounted on a fixture board, as was illustrated, for example, in FIG. 2, and at Block 490, the fixture board is mounted on the fixture housing, as also was illustrated in FIG. 2.

Various embodiments described herein, as illustrated, for example, in FIG. 3, may eliminate the need for a package factory and may also eliminate the need for a module factory. The chip maker may ship completed wafers from the chip factory to a fixture factory or a module factory.

Figure 4:
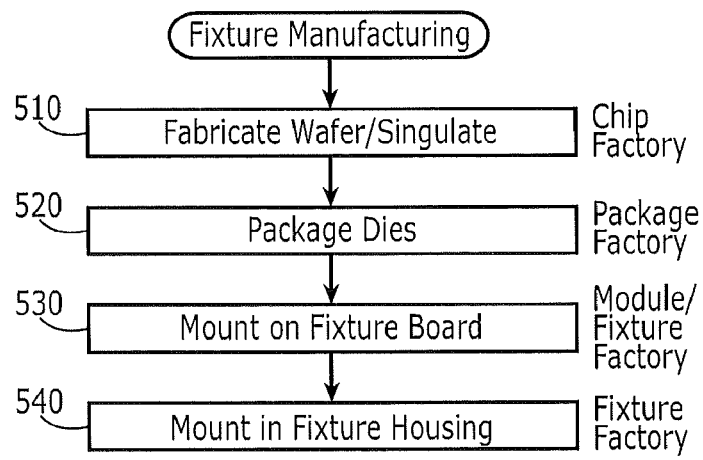
FIG. 4 is a flowchart of conventional fixture manufacturing.

In sharp contrast, FIG. 4 provides an overview of conventional fixture manufacturing. An LED wafer is fabricated and singulated at chip factory, as illustrated in Block 510. The singulated LED chips are then placed on die sheets and sent to a package factory, where the dies are packaged at Block 520. For example, the dies are mounted on a submount or other substrate, encapsulated, and a dome is placed on the encapsulated package. The packaged LEDs are then shipped to a module factory or a fixture factory, where they are mounted on a fixture board, as shown at Block 530. At the fixture factory, the packaged LEDs are mounted in a fixture housing, as shown at Block 540.

Figure 5:
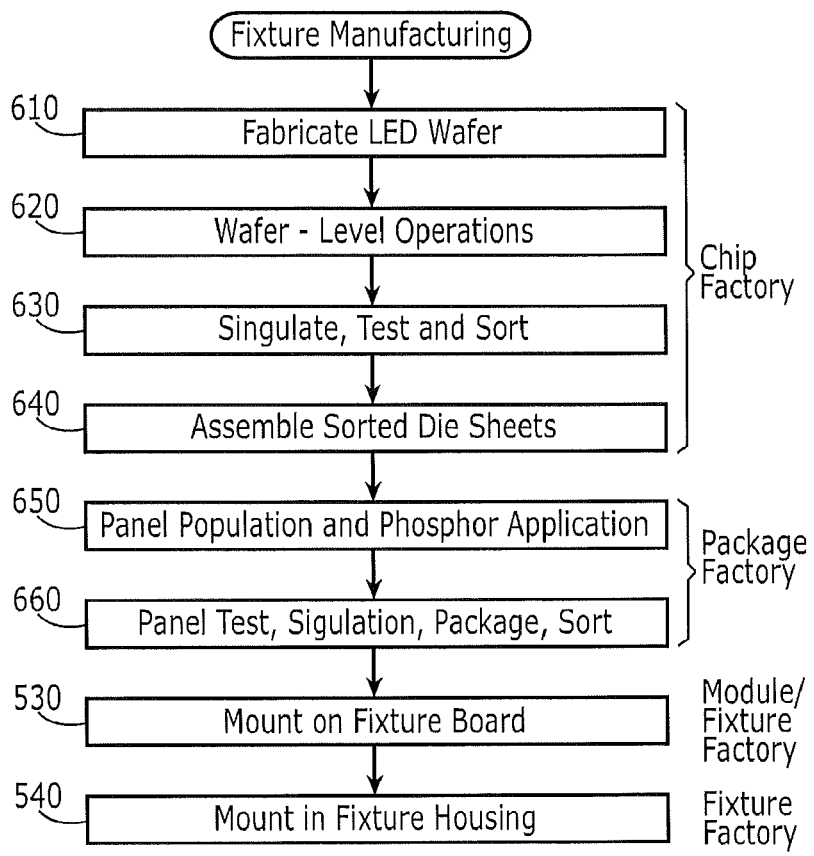
FIG. 5 is a more detailed flowchart of conventional fixture manufacturing.

FIG. 5 illustrates a more detailed flowchart of conventional fixture manufacturing. As illustrated at Block 610, the LED wafer is fabricated. Then, at Block 620, wafer level operations are performed (e.g., die contact formation and electrical testing). At Block 630, the LED dies are singulated, tested and sorted. At Block 640, the sorted LED dies are assembled onto sorted die sheets. The sorted die sheets are then shipped to a package factory, where at Block 660, a panel is populated and phosphor is applied, and the panel is tested, singulated, packaged and sorted again. Finally, operations of Block 530 and 540 are performed.

Figure 6:
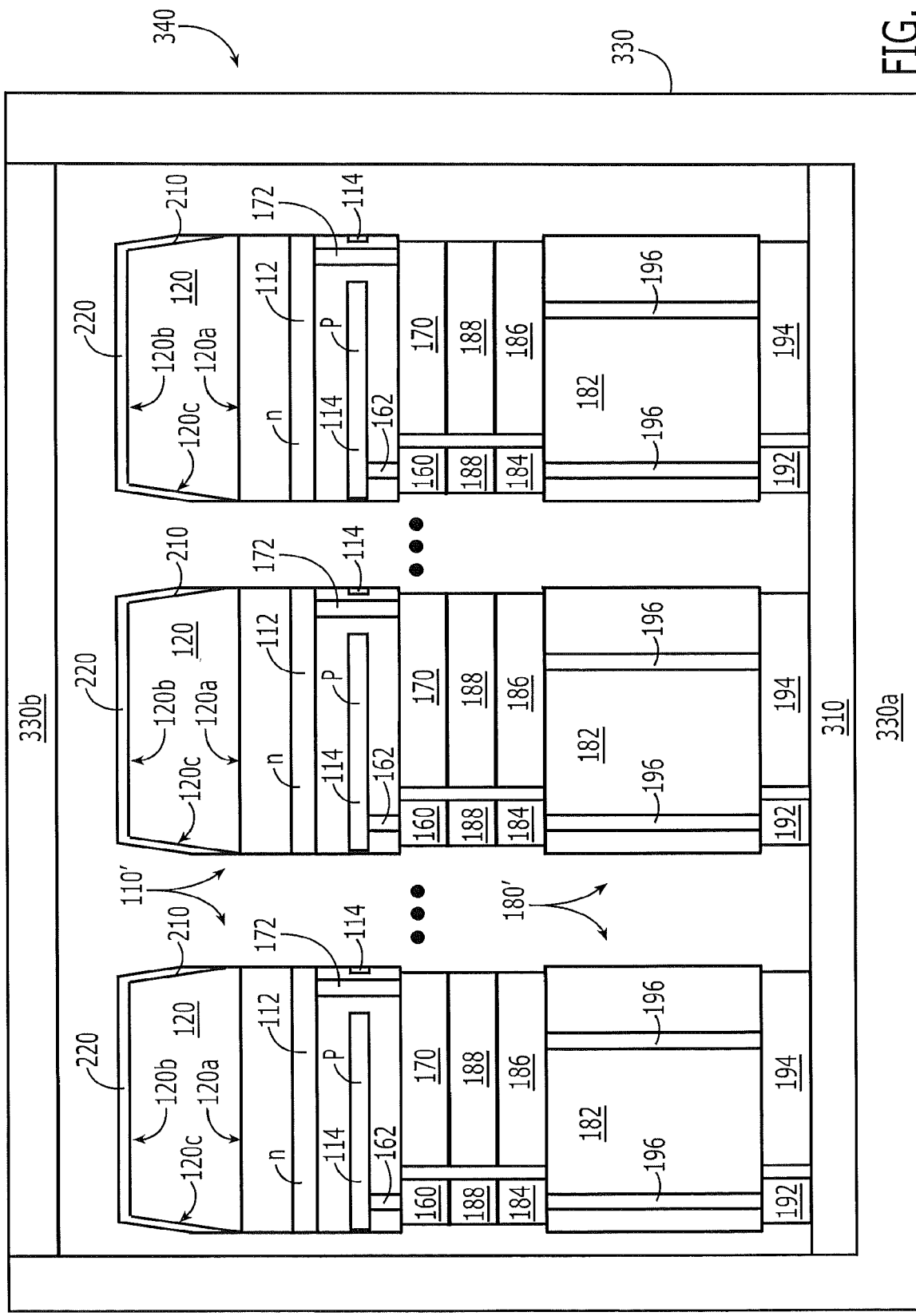
FIG. 6 is a cross-section of LED dies in a light fixture housing according to various embodiments described herein.

As was described above, various embodiments described herein can provide improved efficiency in the fabrication process for LEDs by eliminating/reducing fabrication steps and even eliminating the need for one or two separate factories (a packaging factory and/or a module factory). Moreover, improved luminous efficiency also may be provided according to various embodiments described herein. For example, FIG. 6 illustrates an LED light fixture 340 that includes a light fixture mounting board 310 and a plurality of LED dies 110/110", such as the LED dies of FIGS. 1G, 1J, 1O, 1P and/or 1S-1U directly mounted thereon. LED dies according to any of the embodiments described herein may be used. A light fixture housing 330 is provided, wherein the light fixture mounting board 310 including the plurality of LED dies 110'/110" mounted thereon, is mounted in the housing 330. As shown in FIG. 6, the LED dies may be mounted in the housing without the need for encapsulation and a dome. Thus, the light fixture 340 is free of a dome between a respective LED die 110'/110" and the light fixture housing 330. Because a dome is not needed, the LEDs may be packed much more tightly than is conventionally the case. Higher light output per unit area may thereby be provided. Moreover, although embodiments of FIG. 1G are illustrated in FIG. 6, the carrier dies 180' may optionally also be removed from the LED dies 110' prior to mounting on the LED mounting board 310, so that the plurality of LED dies 110' may be directly mounted on the light fixture mounting board without a carrier die therebetween.

Figure 7:
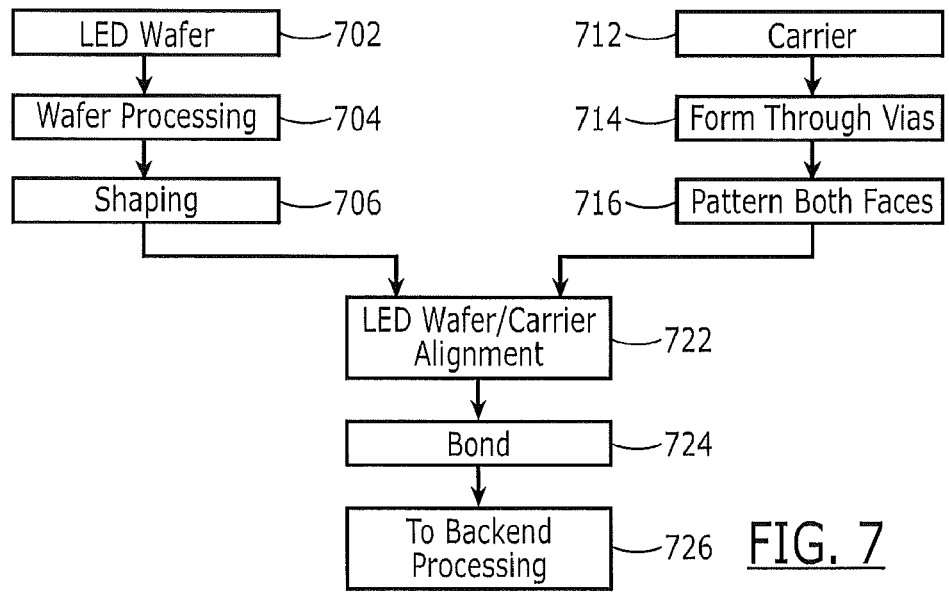
FIGS. 7 and 8 are flowcharts of wafer level packaging of LEDs according to various other embodiments described herein.

FIG. 7 is a flowchart of LED wafer/carrier wafer fabrication according to various other embodiments. As illustrated in FIG. 7, an LED wafer 100 is manufactured at Block 702, as was illustrated, for example, in FIG. 1A, and wafer processing is performed at Block 704 in order to provide standard wafer fabrication operations including metallization. At Block 706, substrate shaping, such as substrate thinning including substrate removal and/or texturing may optionally take place, to provide a final LED wafer thickness of, for example, between about 330 un and about 390 μm, as was illustrated, for example, in FIG. 1M. At Block 712, a carrier, such as a silicon wafer, is fabricated, through vias are formed at Block 714 and both faces of the carrier wafer are patterned at Block 716 to provide contacts, as was illustrated, for example, in FIGS. 1B and 1K. At Block 722, the wafer and carrier are aligned and then bonded at Block 724, for example using eutectic bonding, as was illustrated, for example, in FIG. 1C. The bonded devices then proceed to backend processing operations at Block 726, as will be described in FIG. 8. It will be understood by those having skill in the art that all of the operations of FIG. 7 may be performed at a chip factory, also commonly referred to as a "Fab".

Figure 8:
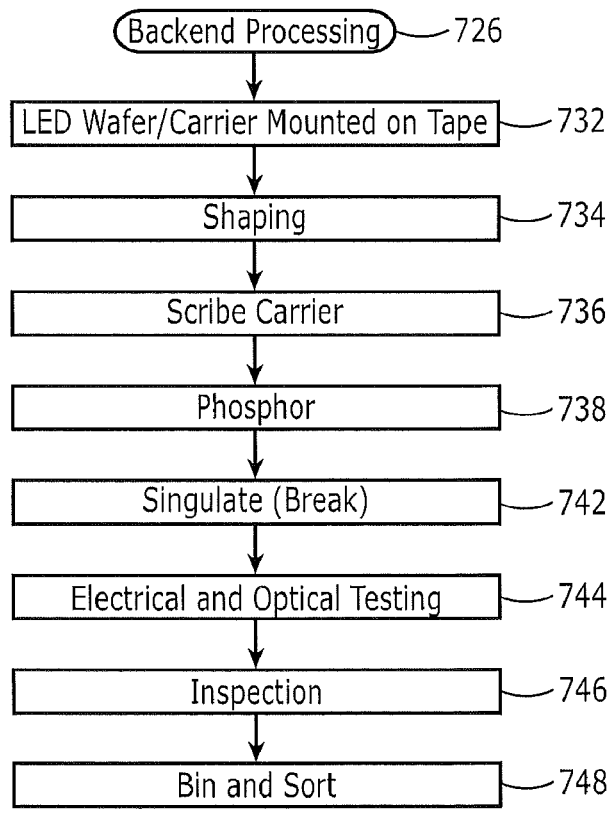

FIG. 8 illustrates the backend processing flow that may also take place at a chip factory or at a module/fixture factory. Referring to FIG. 8, at Block 732, the LED wafer and carrier that are bonded together is mounted on a tape. At Block 734, wafer shaping may take place if applicable. The shaping may include forming an "X"-cut or other top cut along with other operations to texture the LED substrate or the LED die, as was illustrated, for example, in FIG. 1H. A bevel cut may also be performed at Block 734, as was illustrated, for example, in FIGS. 1D, 1L and/or 1M. Scribing of the carrier may also take place at Block 736 using, for example, a straight cut, as was illustrated, for example, at FIG. 1C. A post-saw cleanup using, for example, Reactive Ion Etching (RIE) can then be performed. Phosphor and an optional protective layer are then deposited, for example by spraying or other coating techniques at Block 738, as was illustrated, for example, in FIGS. 1E, 1H and 1N. An initial probe, such as a color target probe, may be performed. Singulation then takes place at Block 742, for example by taking apart the dies using a slotted anvil, as was illustrated, for example, in FIGS. 1F and 1I. The tape may then be stretched to further separate the singulated devices and a post-stretch cure of the tape may then be performed if desired. Electrical and optical testing may then take place at Block 744 and an optical inspection, such as a visual inspection, may take place at Block 746. The LEDs are then binned and sorted at Block 748. It will be understood that operations 732-748 of FIG. 8 may all take place at the chip factory.

Figure 9B:
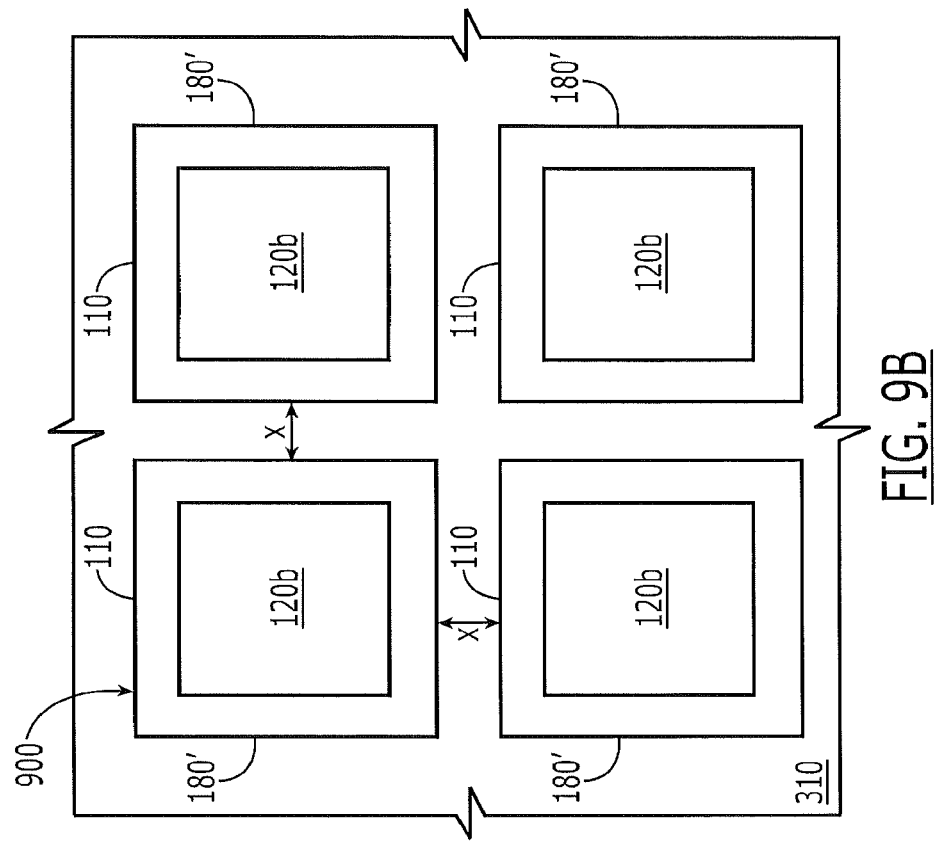
FIG. 9B is a plan view of FIG. 9A.
Figure 9A:
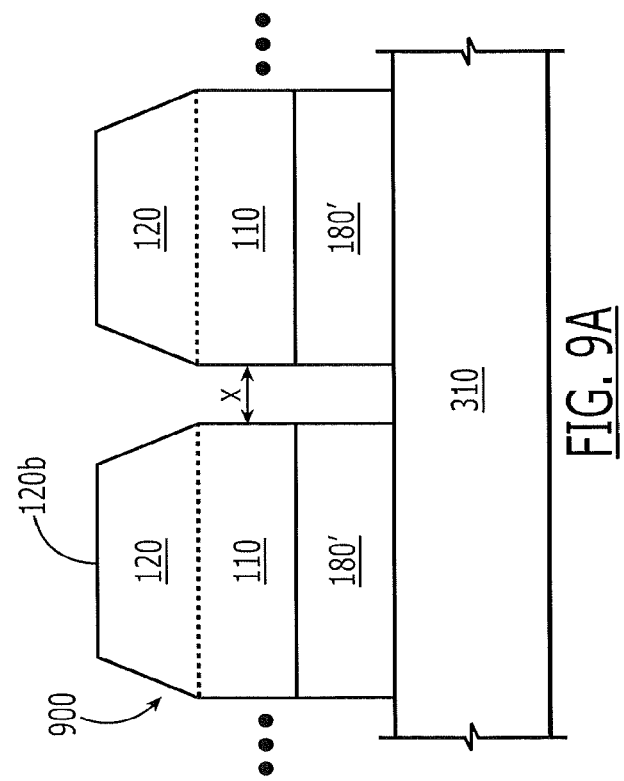
FIG. 9A is a cross-section of a mounting board and a plurality of LED dies mounted thereon according to various embodiments described herein.

FIGS. 9A, 9B, 10A and 10B illustrate an increased packing density or light output per unit area/volume/height that may be provided according to various embodiments described herein. FIG. 9A is a cross-section and FIG. 9B is a plan view of a mounting board 310 with a plurality of LEDs 900 mounted thereon, according to any of the various embodiments described herein. For ease of illustration, the connectors and contacts, the internal structure of the LED and the phosphor/protective layers are not illustrated. As shown, the carrier substrate 180' may be of approximately same size as the LED epi region 110. In other embodiments, the LE) die and the carrier die have sides that are within 100 µm or within about 15% of one another in length. In other embodiments, the LED die and the carrier die have areas that are within 70% of one another, in other embodiments within 85% of one another, and in still other embodiments have same areas. Moreover, a dome or other separate lens need not be provided. Accordingly, packing on the fixture mounting board 310 may be dense.

In sharp contrast, FIG. 10A illustrates conventional packing of LED 810 on a carrier substrate 820, also referred to as a submount, which is in turn mounted on a fixture mounting board 310. Each LED 800 also includes an associated dome 830 thereon. The submount 820 typically needs to be much bigger than the LED die 810 in order to accommodate the dome thereon. Accordingly, the packing density is generally much lower than may be provided according to various embodiments described herein.

Figure 10B:
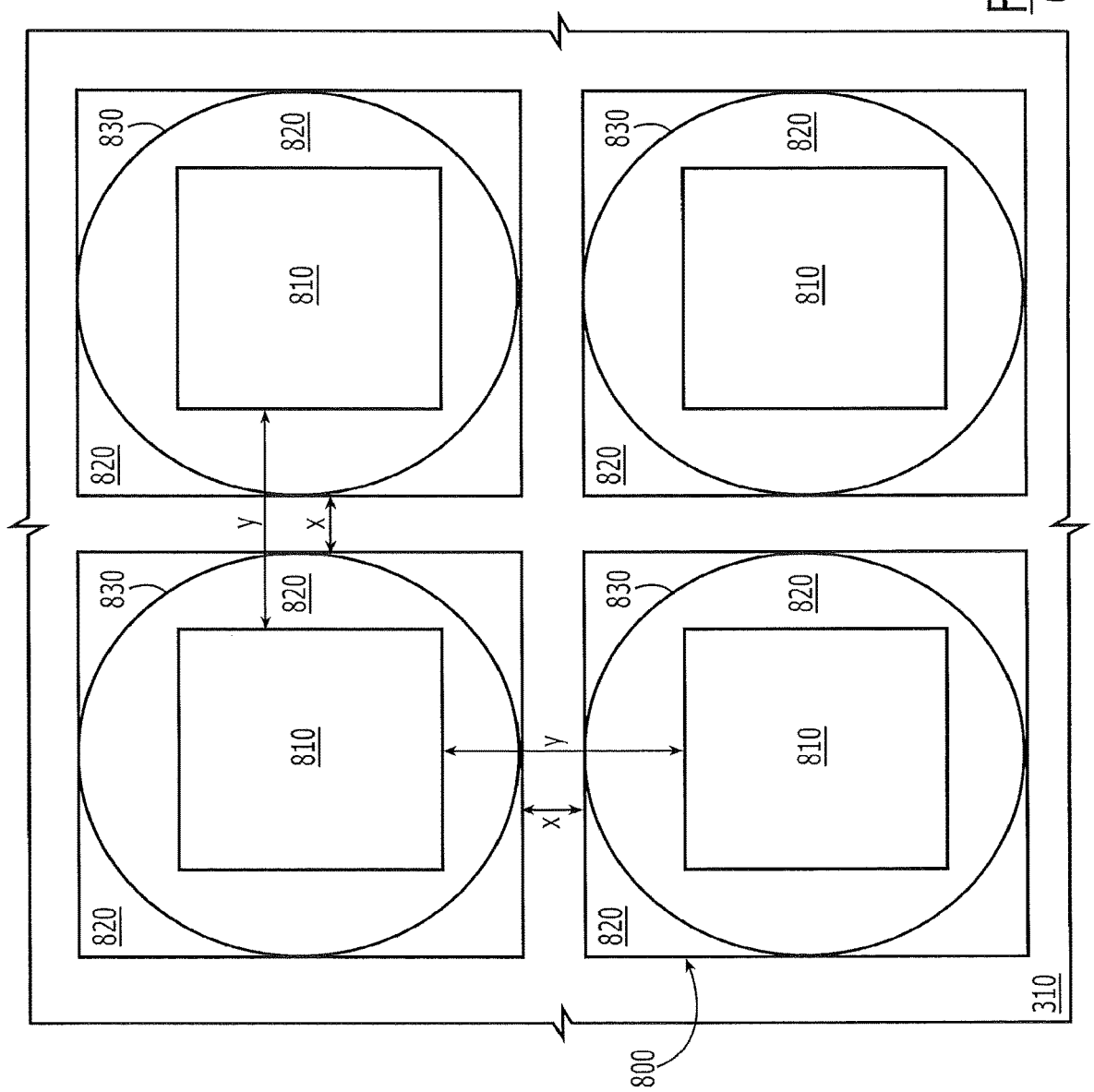
FIG. 10B is a plan view of FIG. 10A.

For example, consider that the LED epi region 110 of FIGS. 9A and 9B and the LED die 810 of FIGS. 10A and 10B are both about 1.0×1.0 mm in size. The carrier substrate 180' of FIGS. 9A and 9B may be slightly larger, for example about 1.1×1.1 mm in size. Thus, according to various embodiments described herein, the carrier substrate 180' of FIGS. 9A and 9B may be about the same size as the LED epi region 110. The spacing between adjacent LEDs 900, shown as "x" in FIGS. 9A and 91, may be about 100 µm in this example. Other LED epi region 110 and die sizes that may be used include 0.5 mm 0.5 mm.

In sharp contrast, in FIGS. 10A and 10B, the submount 820 is much larger than the LED die 810, for example at least about 0.3×3 mm in size using the same LED die size (about 1.0×1.0 mm) as FIGS. 9A/9B. This larger size submount 820 is needed to hold the dome 830. Therefore, the distance "y" between adjacent LED dies 810 may be about 2000 µm, assuming the same submount spacing x. Thus, embodiments of FIGS. 10A-10B have much lower die packing density on the mounting board 310 than various embodiments described herein, for example in FIGS. 9A and 9B. Embodiments of FIGS. 9A and 9B can therefore provide for greater light output per unit area of the mounting board 310.

A comparison between existing LEDs, as illustrated by LEDs 800 of FIGS. 10A and 10B, and LEDs according to various embodiments described herein, as illustrated by LEDs 900 of FIGS. 9A and 9B, will now be provided, to quantitatively illustrate the higher optical efficiency that may be provided according to various embodiments described herein.

Specifically, LEDs 800 of FIGS. 10A and 10B may be represented by a Cree® XLamp® XB-D white LED, as described extensively in the Product Family Data Sheet entitled "Cree® XLamp® XB-D White LED", Cree Document No. CLD-DS45 Rev 4, 2011-2012, the disclosure of which is hereby incorporated herein by reference in its entirety as if set forth herein. As described in this Data Sheet, an XB-D LED die 810 may have dimensions of 0.7 mm×0.7 mm, or about 0.5 mm$^2$. The submount or carrier 820 may have dimensions of 2.45 mm×2.45 mm, or about 6 mm. The total height of the XB-D LED may be 1.84 mm, with the total thickness of the carrier being 0.76 mm and the total thickness of the dome 830 being 108 mm. As noted on the first page of the above-cited Product Family Data Sheet, the XB-D white LED constitutes Cree's smallest lighting class LED, and may produce up to 136 lumens/watt (lm/w) of cool white light at a standard temperature of 85° C. and a standard drive current of 350 mA. Accordingly, on a per-unit area basis, the XB-D LED may produce up to 136 lm/w/ (2.45 mm 2.45 mm) or about 22 lumens per watt per square millimeter.

Figure 11:
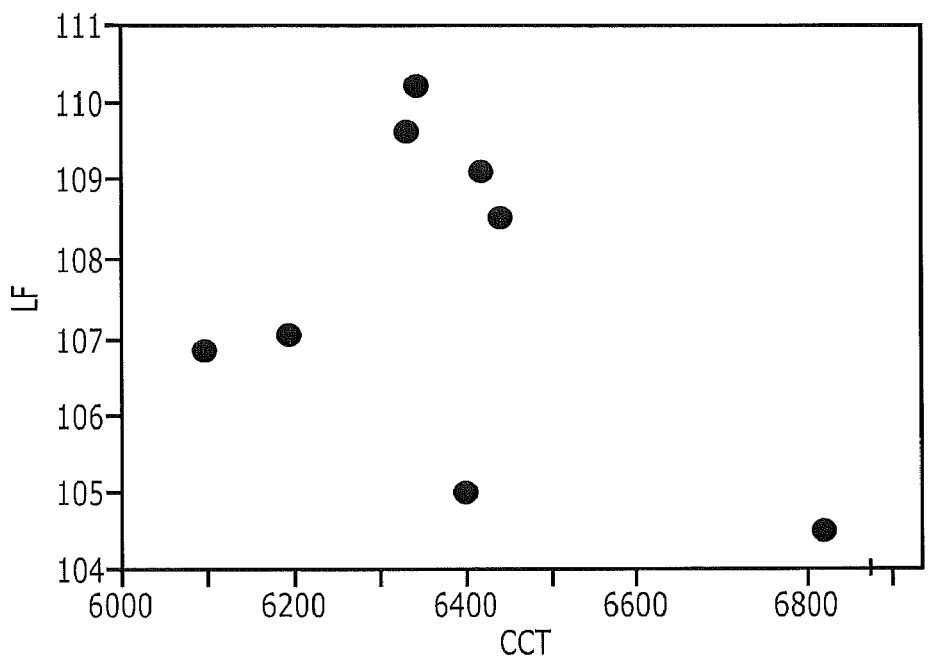
FIG. 11 illustrates performance of wafer level packaged LEDs according to various embodiments described herein.
Figure 12A:
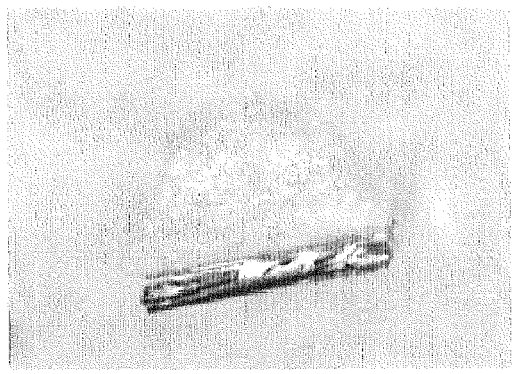
FIG. 12A is a photograph of a prototype LED according to various embodiments described herein, taken from the side.
Figure 12B:
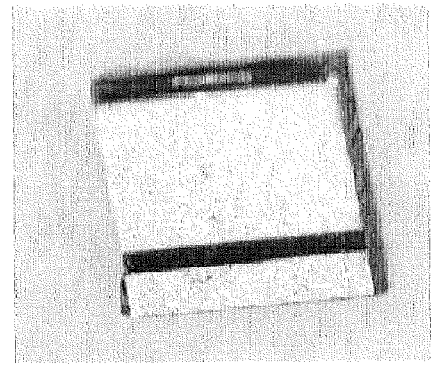
FIG. 12B is a photograph of a prototype LED according to various embodiments described herein, taken from the bottom.
Figure 12C:
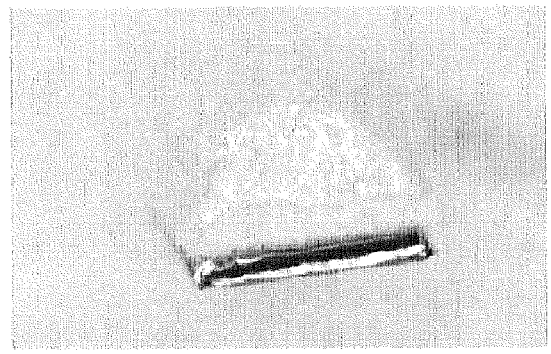
FIG. 12C is another photograph of a prototype LED according to various embodiments described herein, taken from the side.
Figure 12D:
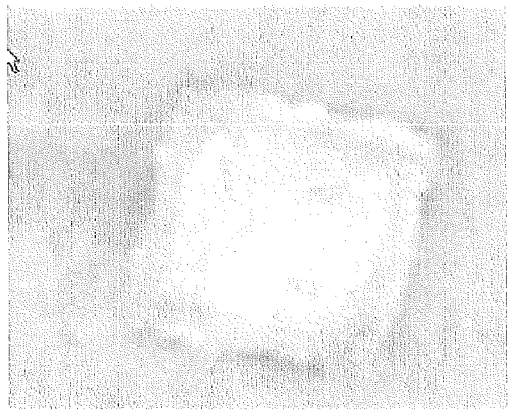
FIG. 12D is a photograph of a prototype LED according to various embodiments described herein, taken from the top.
Figure 12E:
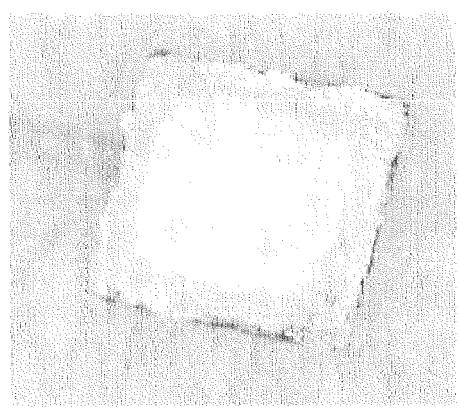
FIG. 12E is another photograph of a prototype LED according to various embodiments described herein, taken from the top.

In sharp contrast, various embodiments described herein, as illustrated in FIG. 9A, may use the same 0.7 mm×0.7 mm LED die 110 as the XB-D LED and may use a carrier die 180' that is also about 0.7 mm-0.7 mm in size. As shown in FIG. 11, various samples of these devices produced between about 105 and about 110 lumens of cool white light (between about 6100 and 6500 K in FIG. 11) for an average output of about 107 lumens per watt. Thus, an LED according to various embodiments described herein may produce 107 lm/w/(0.7 mm×0.7 mm), or at least about 200 lumens per watt per square millimeter. This constitutes an almost tenfold improvement in lumens per watt per square millimeter over the XB-D LED.

Accordingly, various embodiments described herein may provide a semiconductor LED die 900 that includes an LED epi region 110 and a carrier die 180' that is electrically connected to the semiconductor LED die 110, wherein the LED epi region 110 and the carrier die 180' have sides that are within 100 µm of one another, or within 15% of one another, in length. In some embodiments, the LED epi region 110 and the carrier die 180' have same side lengths. In other embodiments, the size difference between the LED epi region 110 and the carrier die 180' of FIG. 9A may be less than about 100 µm, less than about 200 µm, less than about 500 µm, less than about 10%, less than about 5% and, in various embodiments, may be substantially zero (so that the LED epi region 110 and the carrier substrate 180' may be about the same size). These relationships may apply to any carrier die and LED die that are smaller, larger or different from various embodiments described herein. In some embodiments, these LEDs can produce at least 45 lumens per watt per square millimeter of, in some embodiments, cool white light (about 6000 K). In other embodiments, these LEDs can produce at least 100 lumens per watt per square millimeter, and in yet other embodiments, these LEDs can produce at least about 200 lumens per watt per square millimeter of, in some embodiments, cool white light (about 6000 K). For warm white light, these values may be decreased by about 30%, so that various embodiments described herein can produce at least 30 lumens of warm white light (about 3000 K) per watt per square millimeter, and in some embodiments, 70 lumens of warm white light per watt per square millimeter, and in yet other embodiments, at least about 140 lumens of warm white light per watt per square millimeter of area of the carrier die.

The comparative output of the XB-D LED of FIGS. 10A-10B and LEDs according to various embodiments described herein, may also be provided on a "per volume" (mm$^3$) basis. As used herein, "volume" means the product of the area of the carrier die and the total height of the LED, and does not take into account the decreased volume caused by the shape of the dome 830 and/or beveling of the LED die. As described in the above-cited Product Family Data Sheet, the XB-D LED may have a total height of about 1.84 mm, so that its total output per unit volume may be calculated as 136 lm/(2.45 mm×2.45 mm×1.84 mm), or about 12 lumens per watt per cubic millimeter. In sharp contrast, various embodiments as illustrated in FIGS. 9A and 9B, may have a total height of about 1 mm, so as to produce at least 45 lumens per watt per cubic millimeter of volume of the LED in some embodiments, at least about 100 lumens per watt per cubic millimeter of volume of the LED in other embodiments, and at least about 200 lumens per watt per cubic millimeter of volume of the LED in yet other embodiments, of cool white light. Warm white light values may be decreased by about 30%, to produce at least 30 lumens of warm white light per cubic millimeter of volume of the LED in some embodiments, at least 70 lumens of warm white light per watt per cubic millimeter of volume of the ED in other embodiments, and at least about 140 lumens of warm white light per watt per cubic millimeter of volume of the LED in yet other embodiments.

As was described above, various embodiments described herein can provide very small LED die/carrier packages compared to, for example, XB-D LEDs described in the above-cited Product Family Data Sheet. As was described above, the XB-D LED has an area of about 2.45 mm×2.45 mm or about 6 mm$^2$. In contrast, using the same LED die size of 0.7 mm×0.7 mm, various embodiments described herein may have area of about 0.5 mm$^2$. Other embodiments described herein may use a larger die size and a larger carrier size to produce an area of less than about 1 mm$^2$, and yet other embodiments may further increase the die and carrier size to produce an area of less than about 2 mm$^2$. Smaller die sizes may also be used. Moreover, the height of various embodiments described herein may be less than about 1.5 mm in other embodiments.

Other dimensions of various embodiments described herein will now be provided. Specifically, the carrier die 180 may have a thickness of between 50 μm and about 100 μm, and the LD die (epi region 110 and substrate 120) may have a thickness of between about 100 μm and about 1000 m, and in some embodiments may be about 150 μm, about 250 μm or about 400 m thick, and in some embodiments less than about 500 μm thick. A specific embodiment may use a carrier die that is about 100 μm thick and an LED die that is about 335 μm thick. Specific thicknesses for an LED die that is 240 mm×320 mm in area may be about 140 μm; for an area of 500 mm×500 mm may be about 250 μm; for an area of 350 mm×470 mm may be about 155 μm; for an area of about 700 mm×700 mm, 850 mm-850 mm, 1000 mm by 1000 mm or 1400 mm×1400 mm may be about 355 μm. Moreover, commercially available sapphire die may be between 85 μm and about 150 μm thick, and typically less than about 200 μm thick. A phosphor coating may be added in some embodiments, which may have a thickness of less than about 1 mm in some embodiments, between 10 μm and 500 μm in other embodiments, and in yet other embodiments between about 20 μm and about 60 μm.

Accordingly, an LED according to various embodiments described herein may comprise a semiconductor LED die that includes an LED epi region and a carrier die that is electrically connected to the LED die, wherein the LED epi region and the carrier die have sides that are within 100 μm of one another in length and, in some embodiments, have the same side lengths. Moreover, these LEDs may be combined with a light fixture mounting board on which the LED die is mounted and a light fixture housing in which the light fixture mounting board is mounted to provide a light fixture, wherein the light fixture is free of a dome between the LED die and the light fixture housing.

Other embodiments may provide an LED light fixture that includes a light fixture mounting board, a plurality of LEDs mounted on the light fixture mounting board, and a light fixture housing in which the light fixture mounting board including the plurality of LEDs thereon is mounted. The light fixture is free of a dome between a respective LED and the light fixture housing.

FIGS. 12-16 provide photographs of prototype LEDs according to various embodiments described herein. These figures are provided to highlight the scale and/dimensional relationships between the various features of the prototype LEDs, such as the carrier, the epi region, the primary optic and the phosphor layer, according to various embodiments described herein. Specifically, FIG. 12A, is a side photograph, FIG. 12B is a bottom photograph, FIG. 12C is another side photograph and FIGS. 12D and 12E are top photographs of a prototype LED according to various embodiments described herein. FIG. 13A provides a more detailed bottom photograph, and FIG. 13B provides a more detailed top photograph. FIG. 13C provides a side photograph with dimensions, based on a carrier die and substrate die that are 0.7 mm×0.7 mm in size.

Figure 14:
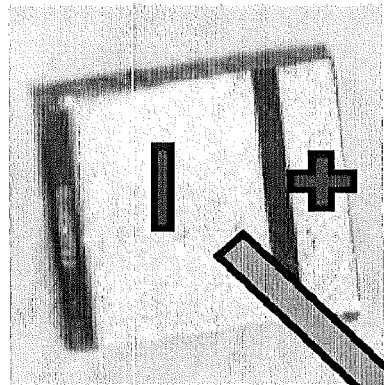
FIG. 14 is a series of photographs of prototype LEDs according to various embodiments described herein, after wafer singulation and biasing of a backside contact.
Figure 14:
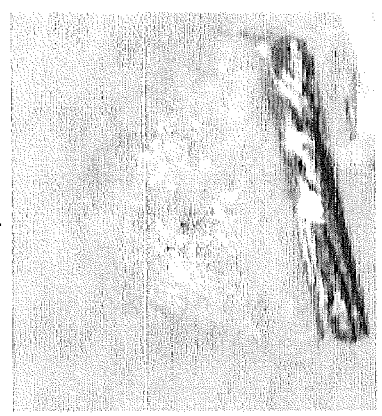
Figure 14:
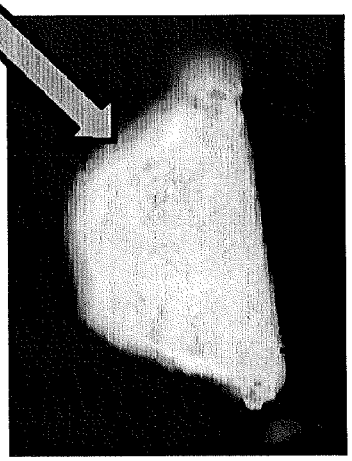
Figure 14:
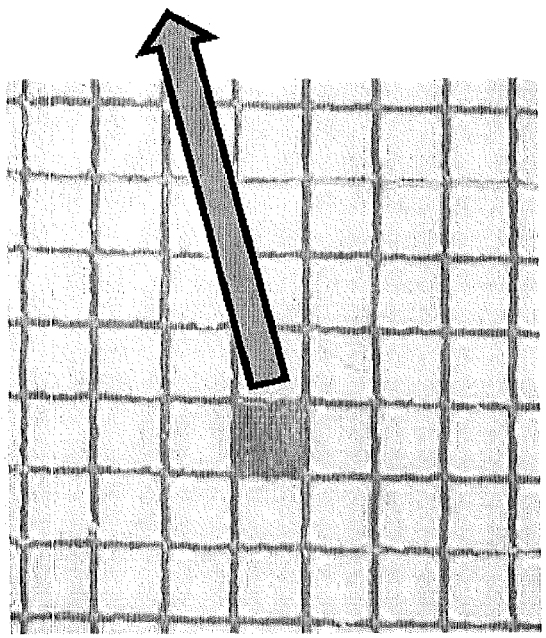
Figure 15:
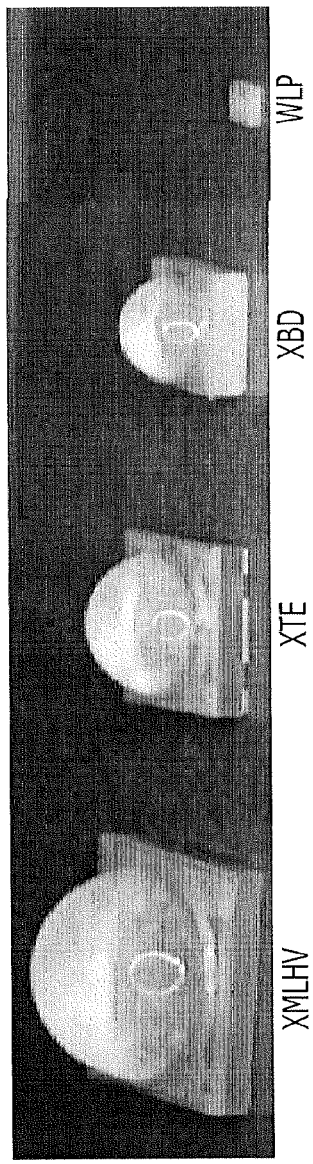
FIG. 15 is a photograph illustrating relative sizes of a prototype LED according to various embodiments described herein (far right side) and other LEDs.
Figure 16:
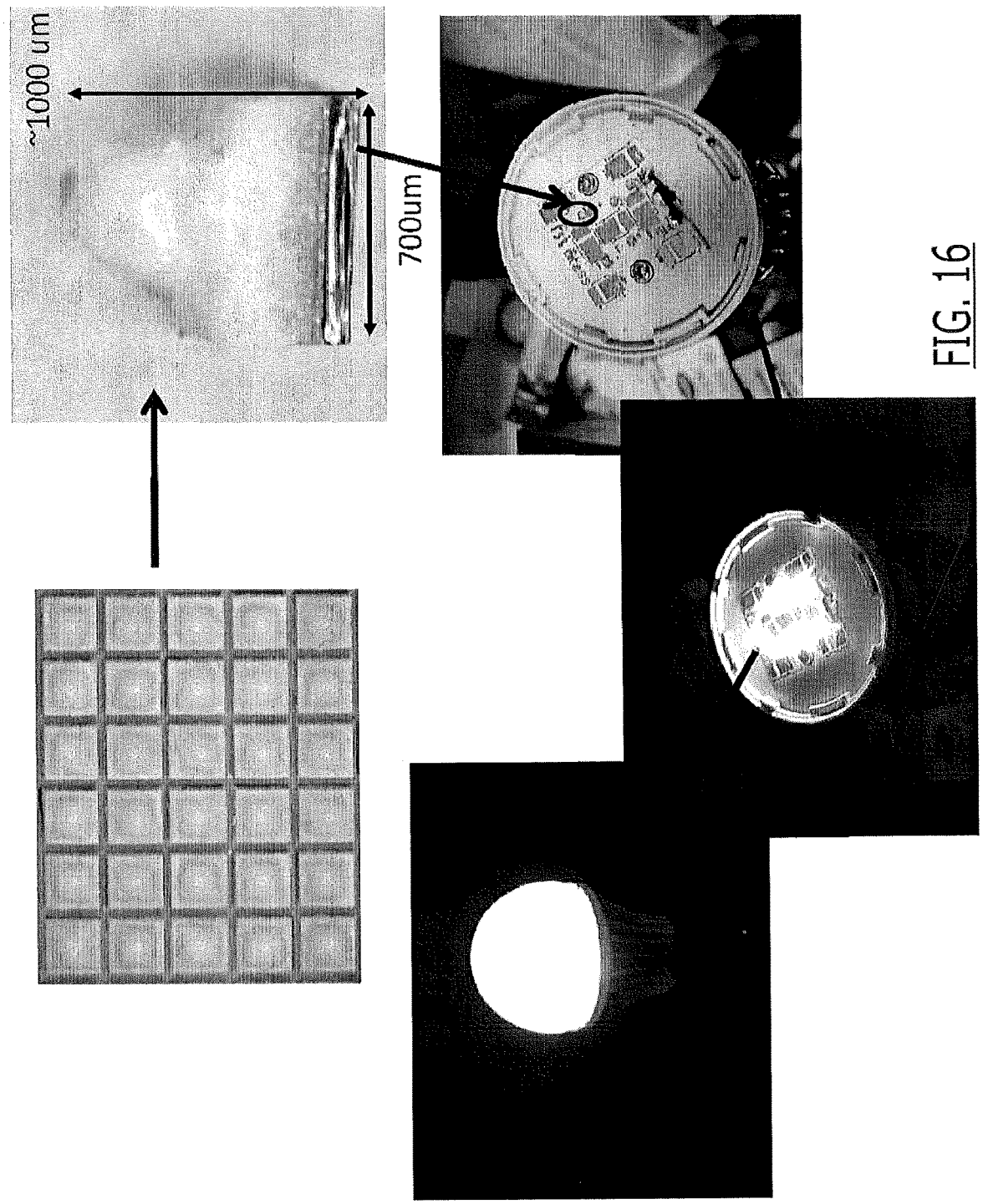
FIG. 16 is a series of photographs of prototype LEDs according to various embodiments described herein after singulation, mounted on a mounting board and mounted in an LED fixture.

FIG. 14 provides photographs of a wafer after singulation, a prototype LED component, a backside contact and a prototype LED under bias. FIG. 15 illustrates relative sizes of various LEDs, such as XM-L high voltage, XT-E and XB-D LEDs available from the assignee, Cree, Inc. wherein a 0.7 mm×0.7 mm LED according to various embodiments described herein is illustrated at the far right and is labeled "WLP". Finally, FIG. 16 provides photographs of an LED according to various embodiments described herein after die separation, and when mounted on a mounting board and installed in a fixture.

Accordingly, various embodiments described herein can move testing and singulation to the very end of the wafer level processing. Production efficiency and/or luminous efficiency may thereby be improved.

Various embodiments have been described herein in connection with operational flowcharts including flowchart blocks. It should be noted that in some alternate embodiments, the functions/acts noted in the blocks may occur out of the order noted in the flowcharts unless expressly stated to the contrary herein. For example, two blocks shown in succession may in fact be executed substantially concurrently or the blocks may sometimes be executed in the reverse order, depending upon the functionality/acts involved, unless expressly stated to the contrary herein. Moreover, the functionality of a given block of the flowcharts may be separated into multiple blocks and/or the functionality of two or more blocks may be at least partially integrated. Finally, other blocks may be added/inserted between the blocks that are illustrated.

Many different embodiments have been disclosed herein, in connection with the above description and the drawings. It will be understood that it would be unduly repetitious and obfuscating to literally describe and illustrate every combination and subcombination of these embodiments. Accordingly, the present specification, including the drawings, shall be construed to constitute a complete written description of all combinations and subcombinations of the embodiments described herein, and of the manner and process of making and using them, and shall support claims to any such combination or subcombination.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A lighting device comprising:
    a crystalline substrate comprising an inner face, an outer face opposing the inner face, and a thickness;
    an array of LEDs supported by the crystalline substrate proximate to the inner face, wherein the array of LEDs comprises a plurality of LEDs, and a plurality of conductive contacts, including a plurality of anode contacts and a plurality of cathode contacts in conductive electrical communication with the array of LEDs, the array of LEDs is arranged to transmit LED emissions through the crystalline substrate to exit the outer face, and the array of LEDs is arranged in a flip-chip configuration, with the array of LEDs positioned between the crystalline substrate and all conductive contacts of the plurality of conductive contacts;
    a plurality of recesses arranged between LEDs of the plurality of LEDs, and extending from the outer face of the crystalline substrate in a direction toward the inner face; and
    a wavelength conversion material arranged on or over the outer face of the crystalline substrate;
    wherein each recess of the plurality of recesses is partially filled with the wavelength conversion material, each recess is partially not filled with the wavelength conversion material, and a non-uniform width of the wavelength conversion material is provided between adjacent LEDs of the plurality of LEDs over a majority of a depth of each recess.

2. The lighting device of claim 1, wherein the crystalline substrate is continuous between different LEDs of the array of LEDs.

3. The lighting device of claim 2, wherein each recess of the plurality of recesses extends through less than an entirety of the thickness of the crystalline substrate.

4. The lighting device of claim 1, wherein the crystalline substrate comprises one of silicon carbide or sapphire.

5. The lighting device of claim 1, wherein the outer face of the crystalline substrate comprises textural features.

6. The lighting device of claim 1, wherein the crystalline substrate comprises a crystalline growth substrate on which epitaxial layers forming the array of LEDs were grown.

7. The lighting device of claim 1, wherein each LED of the array of LEDs is in electrical communication with (i) a different anode contact of the plurality of anode contacts and (ii) a different cathode contact of the plurality of cathode contacts.

8. The lighting device of claim 1, wherein the plurality of anode contacts and the plurality of cathode contacts are coplanar.

9. The lighting device of claim 1, wherein each recess of the plurality of recesses comprises an air gap extending between portions of the wavelength conversion material with which the recess is partially filled.

10. The lighting device of claim 1, wherein each recess of the plurality of recesses comprises beveled walls arranged non-perpendicular to the outer face.

11. The lighting device of claim 1, further comprising a carrier comprising a plurality of anode pads in conductive electrical communication with the plurality of anode contacts, and comprising a plurality of cathode pads in conductive electrical communication with the plurality of cathode contacts.

12. The lighting device of claim 11, wherein:
    the carrier comprises an inner surface and an outer surface that opposes the inner surface;
    the plurality of anode pads and the plurality of cathode pads are arranged on or along the inner surface; and
    the carrier further comprises a plurality of packaged device anodes and a plurality of packaged device cathodes arranged on or along the outer surface.

13. The lighting device of claim 12, wherein the carrier comprises a body, a first group of conductive vias extending through the body to provide conductive electrical communication between the plurality of anode pads and the plurality of packaged device anodes, and a second group of conductive vias extending through the body to provide conductive electrical communication between the plurality of cathode pads and the plurality of packaged device cathodes.

14. A method for fabricating a lighting device, the method comprising:
    growing epitaxial layers over an inner face of a crystalline growth substrate to produce an array of LEDs comprising a plurality of LEDs, the crystalline growth substrate further comprising an outer face opposing the inner face, and a thickness;
    providing a plurality of conductive contacts including a plurality of anode contacts and a plurality of cathode contacts in conductive electrical communication with the array of LEDs, wherein the array of LEDs is arranged in a flip-chip configuration, with the array of LEDs positioned between the crystalline growth substrate and all conductive contacts of the plurality of conductive contacts;
    defining a plurality of recesses in the crystalline growth substrate extending in a direction from the outer face toward the inner face, wherein individual recesses of the plurality of recesses are registered with boundaries between different LEDs of the array of LEDs; and
    providing a wavelength conversion material on or over the outer face of the crystalline growth substrate, and into each recess of the plurality of recesses;
    wherein each recess of the plurality of recesses is partially filled with the wavelength conversion material, each recess is partially not filled with the wavelength conversion material, and a non-uniform width of the wavelength conversion material is provided between adjacent LEDs of the plurality of LEDs over a majority of a depth of each recess.

15. The method of claim 14, wherein the crystalline growth substrate is continuous between different LEDs of the array of LEDs, and each recess of the plurality of recesses extends through less than an entirety of the thickness of the crystalline growth substrate.

16. The method of claim 14, wherein the defining of the plurality of recesses comprises forming beveled walls in the crystalline growth substrate, and the beveled walls are arranged non-perpendicular to the outer face.

17. The method of claim 14, further comprising forming textural features on the outer face of the crystalline growth substrate prior to the provision of the wavelength conversion material on or over the outer face.

18. The method of claim 14, wherein the provision of the wavelength conversion material on or over the outer face comprises controlling a thickness of the wavelength conversion material to sidewalls of each recess of the plurality of recesses, and leaving an air gap extending between portions of the wavelength conversion material with which each recess is partially filled.

19. The method of claim 14, wherein:

the lighting device further comprises a carrier comprising a plurality of anode pads and a plurality of cathode pads; and the method further comprising establishing conductive electrical communication between the plurality of anode pads and the plurality of anode contacts, and establishing conductive electrical communication between the plurality of cathode pads and the plurality of cathode contacts.

20. The method of claim 19, wherein the carrier comprises:

a body having an outer surface:

a plurality of packaged device anodes and a plurality of packaged device cathodes arranged on or along the outer surface;

a first group of conductive vias extending through the body to provide conductive electrical communication between the plurality of anode pads and the plurality of packaged device anodes, and a second group of conductive vias extending through the body to provide conductive electrical communication between the plurality of cathode pads and the plurality of packaged device cathodes.

* * * * *

UNITED STATES PATENT AND TRADEMARK OFFICE
CERTIFICATE OF CORRECTION

| | |
|---|---|
| PATENT NO. | : 11,837,585 B2 |
| APPLICATION NO. | : 17/103509 |
| DATED | : December 5, 2023 |
| INVENTOR(S) | : Michael John Bergmann |

Figure 13A:
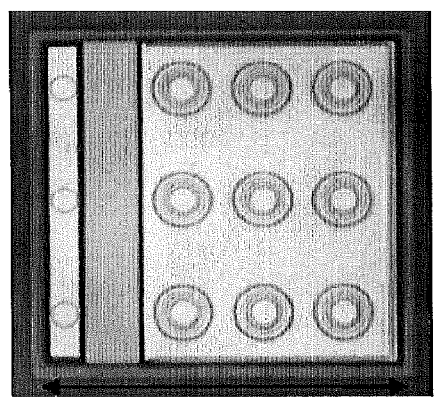
FIG. 13A is a photograph of a prototype LED according to various embodiments described herein, taken from the bottom.
Figure 13B:
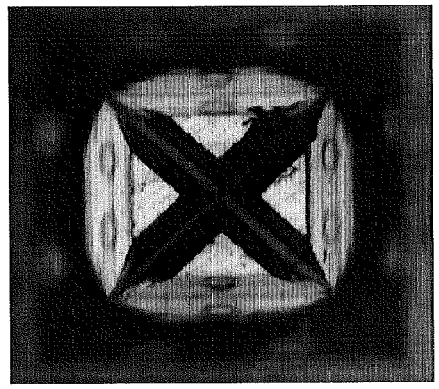
FIG. 13B is a photograph of a prototype LED according to various embodiments described herein, taken from the top.
Figure 13C:
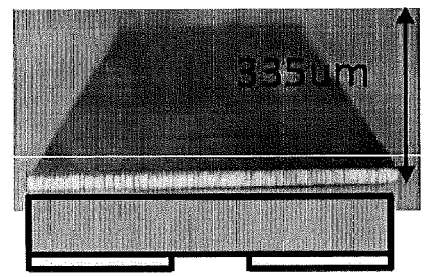
FIG. 13C is aside view of a prototype LED according to various embodiments described herein.

It is certified that error appears in the above-identified patent and that said Letters Patent is hereby corrected as shown below:

In the Specification
Column 5, Lines 22-23, replace "FIG. 13C is aside view of a prototype LED according to various embodiments described herein." with --FIG. 13C is a side view of a prototype LED according to various embodiments described herein.--.
Column 6, Line 36, replace "case of understanding the description herein" with --ease of understanding the description herein--.
Column 7, Line 36, replace "byway of one or more conductive vias 162" with --by way of one or more conductive vias 162--.
Column 7, Line 65, replace "FIG. 1B illustrates a carrier wafer 18) that includes a body" with --FIG. 1B illustrates a carrier wafer 180 that includes a body--.
Column 9, Line 15, replace "201110031502 to Bergann et al" with --201110031502 to Bergmann et al--.
Column 10, Line 20, replace "the carrier wafer 189" with --the carrier wafer 180--.
Column 10, Line 53, replace "Instill other embodiments" with --In still other embodiments--.
Column 11, Line 21, replace "Referring back to Figure D" with --Referring back to Figure 1D--.
Column 11, Line 66, replace "As also shown in FIG. 1" with --As also shown in FIG. 1S--.
Column 12, Line 10, replace "the outer face 120h of the semiconductor LED die" with --the outer face 120b of the semiconductor LED die--.
Column 12, Line 22, replace "FIGS. lG, lJ, 10, lP, lS, 1T and U also illustrate LEDs" with --FIGS. lG, lJ, 10, lP, lS, 1T and 1U also illustrate LEDs--.
Column 12, Line 25, replace "the LED pi region 110" with --the LED epi region 110--.
Column 12, Lines 42-43, replace "the light fixture is free of a dome between the LE) die 320 and the light fixture housing 330" with --the light fixture is free of a dome between the LED die 320 and the light fixture housing 330--.
Column 13, Line 7, replace "in FIGS. lF and/or lL" with --in FIGS. lF and/or lI--.
Column 14, Line 20, replace "330 un" with --330 µm--.
Column 15, Line 7, replace "the LE) die" with --the LED die--.
Column 15, Line 32, replace "as "x" in FIGS. 9A and 91" with --as "x" in FIGS. 9A and 9B--.
Column 15, Line 34, replace "include 0.5 mm 0.5 mm" with --include 0.5 mm × 0.5 mm--.
Column 15, Line 64, replace "or about 6 mm" with --or about 6 mm$^2$--.

Signed and Sealed this
Thirteenth Day of February, 2024

*Katherine Kelly Vidal*
Katherine Kelly Vidal
*Director of the United States Patent and Trademark Office*

CERTIFICATE OF CORRECTION (continued)
U.S. Pat. No. 11,837,585 B2

Column 16, Line 12, replace "about 0.7 mm-0.7 mm in size" with --about 0.7 mm × 0.7 mm in size--.
Column 16, Line 64, replace "136 lm/(2.45 mm×2.45 mm×1.84 mm)" with --136 lm/w/(2.45 mm×2.45 mm×1.84 mm)--.
Column 17, Line 33, replace "and the LD die" with --and the LED die--.
Column 17, Line 34, replace "about 1000 m" with --about 1000 μm--.
Column 17, Line 36, replace "or about 400 m thick" with --or about 400 μm thick--.